(12) United States Patent
Oh et al.

(10) Patent No.: US 12,382,791 B2
(45) Date of Patent: Aug. 5, 2025

(54) DISPLAY DEVICE INCLUDING A MICRO LENS ARRAY

(71) Applicant: LG DISPLAY CO., LTD., Seoul (KR)

(72) Inventors: Jaeyoung Oh, Paju-si (KR); Youngju Koh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 466 days.

(21) Appl. No.: 17/866,045

(22) Filed: Jul. 15, 2022

(65) Prior Publication Data

US 2023/0217733 A1    Jul. 6, 2023

(30) Foreign Application Priority Data

Dec. 30, 2021    (KR) .......................... 10-2021-0192866

(51) Int. Cl.
| | |
|---|---|
| H10K 59/12 | (2023.01) |
| H10K 50/858 | (2023.01) |
| H10K 59/124 | (2023.01) |
| H10K 71/00 | (2023.01) |
| G09G 3/3233 | (2016.01) |

(52) U.S. Cl.
CPC ......... *H10K 59/124* (2023.02); *H10K 50/858* (2023.02); *H10K 71/00* (2023.02); *G09G 3/3233* (2013.01); *G09G 2300/0426* (2013.01); *G09G 2300/0452* (2013.01); *G09G 2300/0842* (2013.01); *G09G 2320/0233* (2013.01); *G09G 2320/043* (2013.01); *H10K 59/1201* (2023.02)

(58) Field of Classification Search
CPC .... H10K 59/124; H10K 50/858; H10K 71/00; G09G 3/3233; G09G 2300/0426; G09G 2300/0452; G09G 2300/0842; G09G 2300/0233; G09G 2300/043
USPC ....................................................... 257/494
See application file for complete search history.

(56) References Cited

U.S. PATENT DOCUMENTS

| | | | |
|---|---|---|---|
| 2018/0006273 A1 | 1/2018 | Kim et al. | |
| 2019/0006626 A1 | 1/2019 | Kim et al. | |
| 2019/0189966 A1 | 6/2019 | Jang et al. | |
| 2020/0058708 A1* | 2/2020 | Jang ....................... | H10K 59/38 |

FOREIGN PATENT DOCUMENTS

| | | | | |
|---|---|---|---|---|
| CN | 105190840 B | * | 10/2018 | |
| CN | 112436044 A | * | 3/2021 | ......... H01L 27/3246 |
| CN | 113253530 A | * | 8/2021 | |
| EP | 3462513 A1 | | 4/2019 | |
| EP | 3477446 A1 | * | 5/2019 | ............... B32B 7/12 |

(Continued)

OTHER PUBLICATIONS

European Patent Office, Extended European Search Report, European Patent Application No. 22204693.0, Jun. 6, 2023, seven pages.

*Primary Examiner* — Phuc T Dang
(74) *Attorney, Agent, or Firm* — Fenwick & West LLP

(57) ABSTRACT

Disclosed is a display device including a substrate including a plurality of sub-pixels, each of the plurality of sub-pixels including a light emitting area, a first planarization film on the substrate, an ashing stop film on the first planarization film, a second planarization film on the ashing stop film and including a micro lens array that overlaps the light-emitting area, and a first electrode on the second planarization film and an exposed face of the micro lens array.

18 Claims, 31 Drawing Sheets

(56) References Cited

FOREIGN PATENT DOCUMENTS

| KR | 20070050294 A | * | 5/2007 |
|----|---------------|---|--------|
| KR | 10-2021-0039230 A | | 4/2021 |
| KR | 102255063 B1 | | 5/2021 |
| KR | 10-2021-0073961 A | | 6/2021 |

* cited by examiner

DISPLAY DEVICE INCLUDING A MICRO LENS ARRAY

CROSS-REFERENCE TO RELATED APPLICATION

This application claims priority from Republic of Korea Patent Application No. 10-2021-0192866 filed on Dec. 30, 2021 in the Korean Intellectual Property Office, which is incorporated by reference in its entirety.

BACKGROUND

Field

The present disclosure relates to a display device capable of improving luminance.

Description of Related Art

Display devices are being applied to various electronic devices such as TVs, mobile phones, laptops, and tablets. To this end, research to develop thinner, lighter, and lower power consuming display devices, etc. is continuing.

The display device may include a liquid crystal display device (LCD), a plasma display panel device (PDP), an organic light-emitting display device (OLED), and the like.

Among those, the organic light-emitting display device (OLED) includes a plurality of pixel areas disposed in a display area in which an image is displayed and a plurality of organic light-emitting elements corresponding to the plurality of pixel areas. Because the organic light-emitting element is self-emissive that emits light by itself, the organic light-emitting display device may have faster response speed, greater luminous efficiency, luminance and viewing angle, and excellent contrast ratio and color gamut compared to other display devices.

The organic light-emitting display device includes a light emitter and a circuit for operating the light emitter. The circuit includes a thin-film transistor and a storage capacitor. Such organic light-emitting display device is in a bottom emission scheme in which light generated from a light-emitting layer is emitted in a direction opposite to a substrate, that is, in a rearward direction of the substrate, the light is not able to be emitted to the outside in an area in which the circuit is disposed. Accordingly, there is a limitation in increasing an amount of light, so that, in order to display an image of a desired brightness, there is a problem in that an amount of current supply increases and a lifespan of the organic light-emitting element decreases.

SUMMARY

The present disclosure is to provide a display device for improving luminance by increasing a light extraction efficiency.

Further, the present disclosure is to provide a display device introducing an ashing stop film to have a micro lens array having a uniform vertical dimension to increase a light extraction efficiency, thereby improving luminance.

Further, the present disclosure is to improve luminance and increase a lifespan of an organic light-emitting element by introducing a microlens array having a uniform vertical dimension.

In addition, the present disclosure is to improve luminance by increasing an amount of light by introducing a reflective area in a pixel area.

In addition, the present disclosure is to increase a capacitance of a storage capacitor.

Purposes of the present disclosure are not limited to the above-mentioned purpose. Other purposes and advantages of the present disclosure that are not mentioned may be understood based on following descriptions, and may be more clearly understood based on embodiments of the present disclosure. Further, it will be easily understood that the purposes and advantages of the present disclosure may be realized using means shown in the claims and combinations thereof.

A display device according to one embodiment of the present disclosure includes a substrate including a plurality of sub-pixels, a light-emitting area included in each of the sub-pixels, a first planarization film positioned on the substrate, an ashing stop film positioned on the first planarization film, a second planarization film positioned on the ashing stop film and including a micro lens array disposed to overlap the light-emitting area, and a first electrode positioned on the second planarization film and an exposed face of the micro lens array.

A display device according to another embodiment of the present disclosure includes a substrate including a plurality of sub-pixels, a light-emitting area included in each of the sub-pixels and a circuit area where a driving circuit element is located, a first planarization film positioned on the substrate, a transparent electrode positioned on the first planarization film, a reflective electrode pattern positioned on the transparent electrode and overlapping the circuit area, a bank for exposing the reflective electrode pattern and the transparent electrode of the light-emitting area, a micro lens array disposed on the transparent electrode and disposed in the light-emitting area, and a first electrode positioned on an exposed face of the micro lens array.

According to embodiments of the present disclosure, the micro lens array including the plurality of micro lens patterns having the uniform vertical dimension may be formed by introducing the ashing stop film onto the light-emitting area, thereby improving the light extraction efficiency.

Further, because the micro lens patterns having the uniform vertical dimension may be realized, the stain defect may be prevented from occurring in the display area where the image is displayed.

In addition, as the reflective area is introduced to the sub-pixel, the light is reflected to the light-emitting area to increase the amount of light, thereby improving the luminance.

Accordingly, the luminance may be improved under the same power consumption to increase the lifespan of the organic light-emitting element, thereby improving the reliability of the display device.

In addition, as the ashing stop film acts as the auxiliary capacitor, the area occupied by the storage capacitor in the circuit area may be reduced to secure the opening ratio, but the total area occupied by the capacitor in the sub-pixel may be widened to increase the capacitance of the storage capacitor, thereby stably maintaining the light-emitting time of the sub-pixel.

Effects of the present disclosure are not limited to the above-mentioned effects, and other effects as not mentioned will be clearly understood by those skilled in the art from following descriptions.

DETAILED DESCRIPTION

Figure 1:
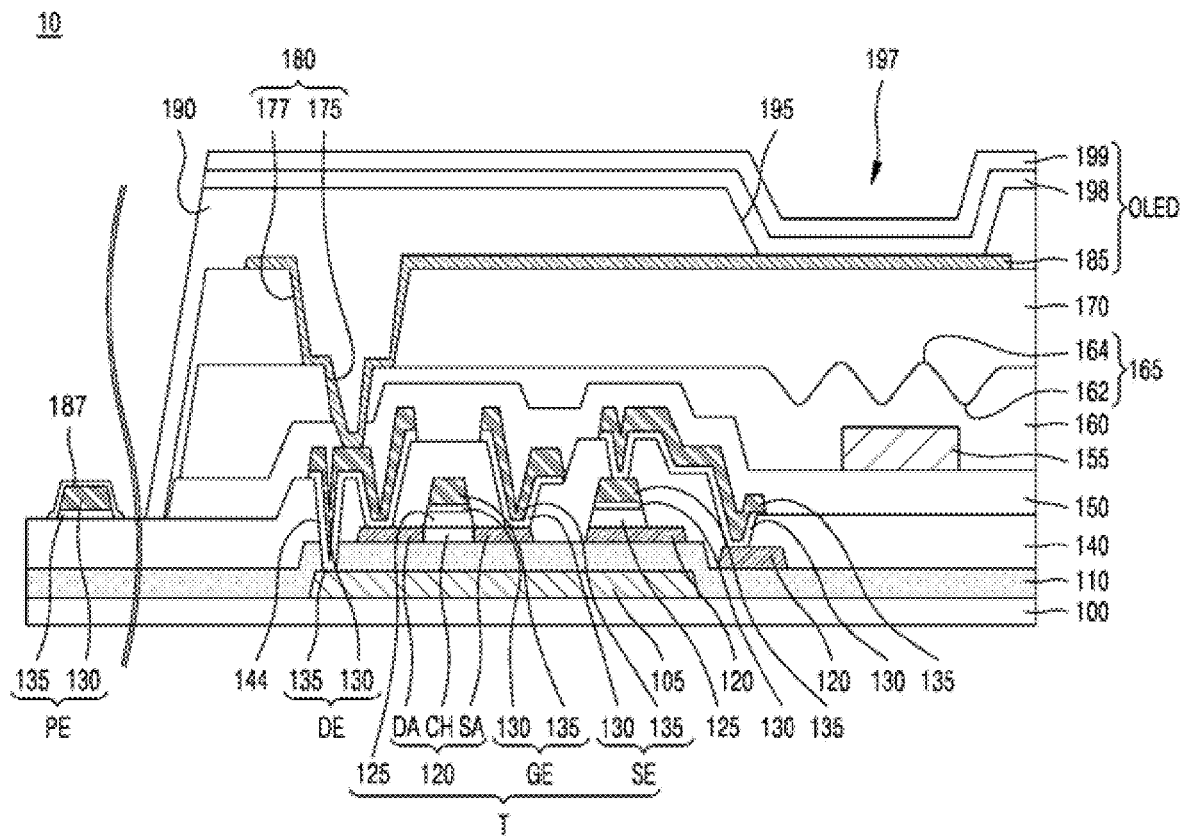
FIG. 1 is a cross-sectional view of a display device according to a first embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "having" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to each embodiment of the present disclosure will be described with reference to the accompanying drawings.

Figure 2:
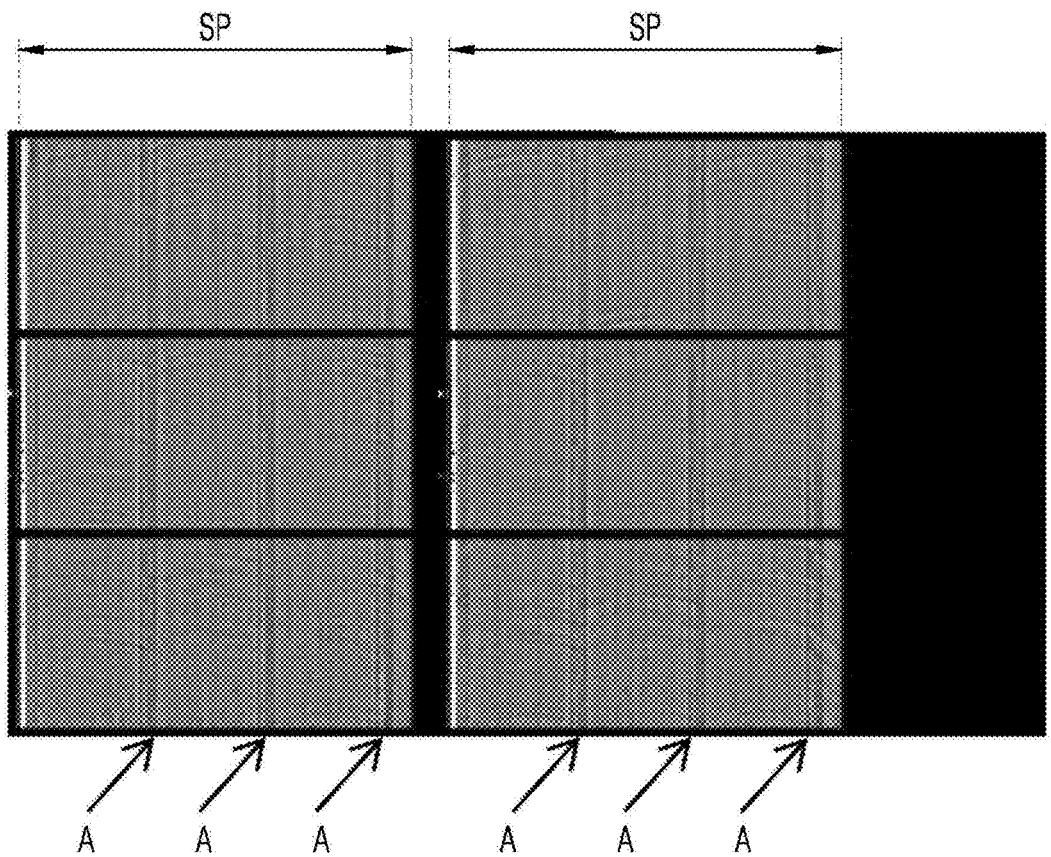
FIG. 2 is a picture for illustrating a stain on a display device.

FIG. 1 is a cross-sectional view of a display device according to a first embodiment of the present disclosure. In addition, FIG. 2 illustrates a stain on a display device.

Referring to FIG. 1, a display device 10 according to the first embodiment of the present disclosure may include, on a substrate 100, a light-blocking layer 105, a buffer layer 110, a driving transistor T, an interlayer insulating film 140, a protective layer 150, a color filter 155, a first planarization film 160 on which a micro lens pattern 165 is formed, a second planarization film 170, a first electrode 185, a bank 190, an organic light-emitting layer 198, and a second electrode 199.

The light-blocking layer 105 may be disposed on the substrate 100 to overlap the driving transistor T. The buffer layer 110 is disposed on the light-blocking layer 105. The buffer layer 110 may include at least one of an inorganic insulating film and an organic insulating film.

The driving transistor T may be disposed on the buffer layer 110. The driving transistor T may include an active layer 120, a gate electrode GE, a source electrode SE, and a drain electrode DE. The active layer 120 is disposed on the buffer layer 110 to overlap the light-blocking layer 105. The active layer 120 includes a source area SA and a drain area DA that face each other with a channel area CH interposed therebetween. The channel area CH is disposed to overlap the gate electrode GE with a gate insulating layer 125 interposed therebetween. A gate in which the gate insulating layer 125 and the gate electrode GE are stacked may be disposed on the active layer 120.

The gate electrode GE may be formed in a structure in which a first metal layer 130 and a second metal layer 135 are stacked. The source electrode SE is disposed in direct contact with the source area SA of the active layer 120, and the drain electrode DE is disposed in direct contact with the drain area DA of the active layer 120. The source electrode SE and the drain electrode DE may be made of the same material as that of the gate electrode GE.

The drain electrode DE is electrically connected to the first electrode 185 via a pixel contact hole 180 extending through the protective layer 150, the first planarization film 160, and the second planarization film 170. Further, the drain electrode DE may be connected to the light-blocking layer 105 via a light-blocking contact hole extending through the buffer layer 110.

The interlayer insulating film 140, the protective layer 150, and the first planarization film 160 are disposed on the substrate 100 on which the gate electrode GE is formed. The color filter 155 is disposed on the protective layer 150. The color filter 155 is disposed at a location to overlap the light-emitting area 197. The color filter 155 may represent a color assigned to each sub-pixel. For example, the color filter 155 may represent one color among red (R), green (G), and blue (B).

The first planarization film 160 includes a micro lens array 165. The micro lens array 165 has a shape in which a plurality of concave portions 162 and a plurality of convex portions 164 are alternately arranged and connected to each other. The second planarization film 170 is disposed on the first planarization film 160 including the micro lens array 165. As the second planarization film 170 is formed on the substrate 100 for a flat surface, the second planarization film 170 covers both the concave portion 162 and the convex portion 164 of the micro lens array 165. In one example, the concave portion 162 may also be referred to as a valley, and the convex portion 164 may also be referred to as a mountain.

The pixel contact hole 180 exposes a portion of a surface of the drain electrode DE. The pixel contact hole 180 includes a first pixel contact hole 175 extending through the protective layer 150 and the first planarization film 160 and a second pixel contact hole 177 extending through the second planarization film 170.

The first electrode 185 is disposed on the second planarization film 170 and the pixel contact hole 180 to be electrically connected to the drain electrode DE. The first electrode 185 is disposed on the second planarization film 170 to overlap a light-emitting area 197 defined by a bank hole 195 defined in the bank 190, and a driving circuit element including the driving transistor T. The first electrode 185 contains a transparent metal oxide such as an indium-tin-oxide (ITO) or an indium-zinc-oxide (IZO).

The organic light-emitting layer 198 is disposed on a top face of the bank 190 and extends while being connected to the first electrode 185 exposed by the bank hole 195. The second electrode 199 is disposed on the organic light-emitting layer 198. Accordingly, an organic light-emitting element (OLED) composed of the first electrode 185, the organic light-emitting layer 198, and the second electrode 199 is formed. The second electrode 199 applies a voltage while being commonly in contact with adjacent sub-pixels on the display area.

In the first embodiment of the present disclosure, the micro lens array 165 is formed by etching a portion of the first planarization film 160. The micro lens array 165 increases an external light-emitting efficiency via multiple reflections to achieve a maximum external light extraction efficiency.

However, there is a problem in that a vertical dimension of each of the concave portions 162 and the convex portions 164 of the micro lens array 165 is non-uniform. A photoresist pattern is formed using processes including exposure and development processes of a photoresist film, and the micro lens array 165 is formed by etching the first planarization film 160 using such photoresist pattern. However, a vertical dimension of the photoresist pattern may be non-uniform due to problems such as defocus of an exposure tool, an etching thickness tolerance, and the like.

In addition, when the micro lens pattern 165 is formed using such photoresist pattern, when displaying an image on the display device, as shown in FIG. 2, in the light-emitting area of each sub-pixel SP, a stain defect A may occur at a boundary between the concave portion 162 and the convex portion 164 of the micro lens pattern 165. The stain defect A may act as a problem of lowering a reliability of the display device as an image quality is lowered.

Accordingly, in another embodiment of the present disclosure, a display device that may prevent or at least reduce the stain defect from occurring by forming a micro lens pattern with a uniform vertical dimension will be described. Hereinafter, a description will be made with reference to drawings below.

Figure 3:
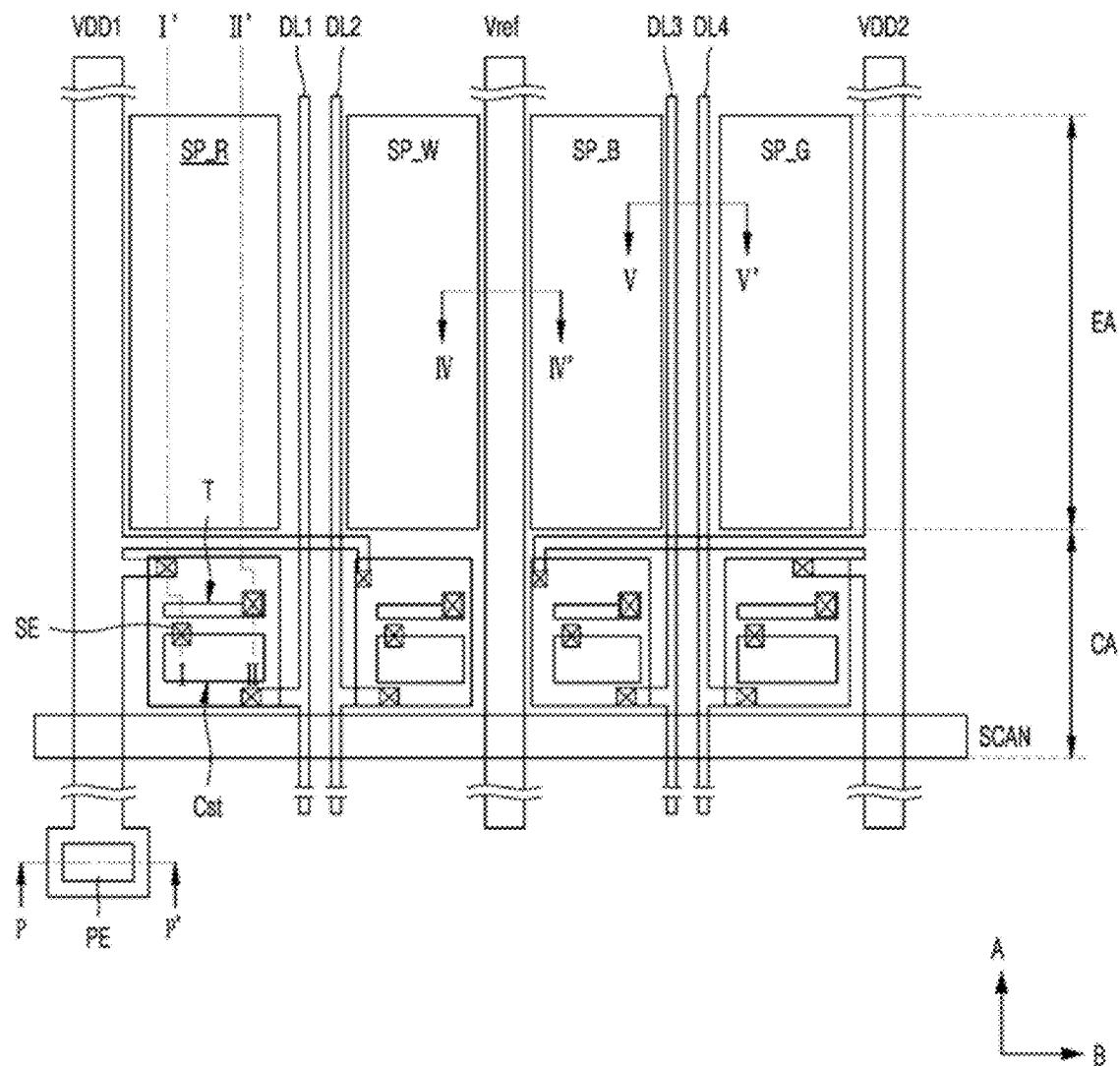
FIG. 3 is a plan view of a display device according to a second embodiment of the present disclosure.

FIG. 3 is a plan view of a display device according to a second embodiment of the present disclosure. In addition, FIG. 4 is a cross-sectional view of FIG. 3 cut along P-P', I-I, II-II' directions according to the second embodiment of the present disclosure.

Figure 4:
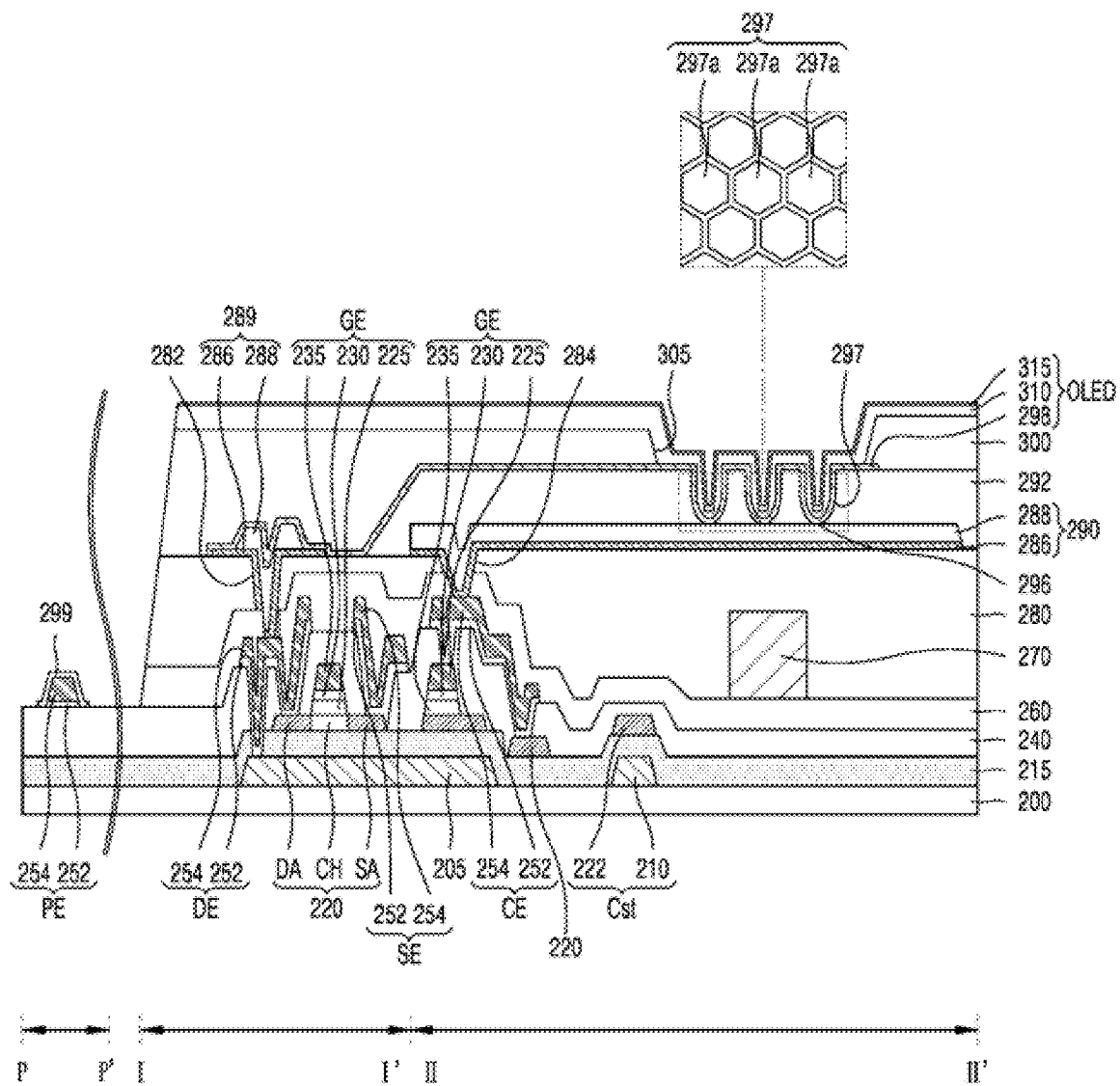
FIG. 4 is a cross-sectional view of FIG. 3 cut along P-P', I-I, II-II' directions according to the second embodiment of the present disclosure.

Referring to FIGS. 3 and 4, a display device 20 includes a light-emitting area EA in which the organic light-emitting element (OLED) emitting light is disposed, and a circuit area CA with driving circuit elements for supplying a driving current to the organic light-emitting element (OLED). The light-emitting area EA and the circuit area CA are arranged in a display area in which a plurality of sub-pixels SP_R, SP_W, SP_B, and SP_G are arranged. In the embodiment of the present disclosure, some SP_R, SP_W, SP_B, and SP_G of the sub-pixels are shown, but the sub-pixels may be arranged in a matrix form (M*N, M and N are natural numbers) on the display area. The sub-pixels SP_R, SP_W, SP_B, and SP_G include a red pixel SP_R, a blue pixel SP_B, a green pixel SP_G, and a white pixel SP_W.

Each of the sub-pixels SP_R, SP_W, SP_B, and SP_G arranged in the display area includes the driving circuit element disposed in the circuit area CA and the organic light-emitting element (OLED) disposed in the light-emitting area EA.

A plurality of line electrodes may be disposed on the display device 10. The line electrodes supply signals to the organic light-emitting elements and the driving circuit elements, and include driving power supply lines VDD1 and VDD2, data lines DL1, DL2, DL3, and DL4, a reference power supply line Vref, and a scan line SCAN. The driving power supply lines VDD1 and VDD2, the data lines DL1, DL2, DL3, and DL4, and the reference power supply line Vref may be arranged in a first direction A, which is a vertical line on the display device 10, and the scan line SCAN may be disposed in a second direction B, which is a horizontal line. The line electrode may include a light-blocking layer 205 of an opaque metallic material. A pad electrode PE connected to each of the line electrodes and supplying a driving signal may be disposed on the display device 10.

In the circuit area CA, the driving circuit elements for supplying the driving current to the organic light-emitting element (OLED) are arranged. The driving circuit elements may include a thin-film transistor T and a storage capacitor Cst.

The thin-film transistor T includes the gate electrode GE, the source electrode SE, the drain electrode DE, and an active layer 220. The gate electrode GE is positioned to overlap a channel area CH of the active layer 220. A gate insulating layer 225 is disposed between the gate electrode GE and the channel area CH of the active layer 220. The gate electrode GE may have a structure in which a first gate metal 230 and a second gate metal 235 are stacked. The first gate metal 230 and the second gate metal 235 may include molybdenum (Mo), aluminum (Al), chromium (Cr), gold (Au), titanium (Ti), nickel (Ni), neodymium (Nd), and copper (Cu) or may be made of an alloy thereof.

The active layer 220 includes a source area SA and a drain area DA facing each other with the channel area CH interposed therebetween. The source electrode SE is electrically connected to the source area SA of the active layer 220, and the drain electrode DE is electrically connected to the drain area DA of the active layer 220. The source electrode SE and the drain electrode DE may be formed in a structure in which a first metal layer 252 and a second metal layer 254 are stacked.

The drain electrode DE is electrically connected to a first electrode 298 via a first ashing stop film 289 filling a pixel contact hole 282 defined to extend through a planarization film 280 and a protective layer 260. Further, the drain electrode DE may be electrically connected to the light-blocking layer 205 via a light-blocking contact hole extending through an interlayer insulating film 240 and a buffer layer 215.

The storage capacitor Cst is formed by disposing a storage lower electrode 210 and a storage upper electrode 222 with the buffer layer 215 interposed therebetween. In this regard, the storage lower electrode 210 is made of the same material as that of the light-blocking layer 205, and the storage upper electrode 222 is made of the same material as that of the active layer 220 and is disposed on the same plane as the active layer 220.

A first planarization film 280 is disposed on the protective layer 260 on which a color filter 270 is disposed. The first planarization film 280 may have a thickness sufficient to allow a surface of the substrate 100 to be flat. The first planarization film 280 may be formed to have a thickness to cover an exposed face of the color filter 260. The first planarization film 280 includes the pixel contact hole 282 and an auxiliary capacitor contact hole 294.

Ashing stop films 289 and 290 are positioned on the first planarization film 280. The ashing stop films 289 and 290 may include a first ashing stop film 289 filling the pixel contact hole 282 a the second ashing stop film 290 filling an auxiliary capacitor contact hole 284. Each of the ashing stop films 289 and 290 may be formed in a structure in which a transparent electrode 286 and an insulating pattern 288 are sequentially stacked. In one example, the transparent electrode 286 may be made of the transparent metal oxide such as the indium-tin-oxide (ITO) or the indium-zinc-oxide (IZO). Further, the insulating pattern 288 may be made of an inorganic insulating material such as a silicon oxide (SiOx).

The transparent electrode 286 of the first ashing stop film 289 may be formed along an exposed face of the pixel contact hole 282 and may extend to a surface of the first planarization film 280. The insulating pattern 288 of the first ashing stop film 289 may be formed on the transparent electrode 286 and may be formed to fill the pixel contact hole 282. In this regard, the transparent electrode 286 of the first ashing stop film 289 may extend longer to the surface of the first planarization film 280 than the insulating pattern 288 of the first ashing stop film 289, so that a portion of a surface thereof may be exposed.

The second ashing stop film 290 may extend to the surface of the first planarization film 280 along a shape of an exposed face of the auxiliary capacitor contact hole 284, and may be formed on an entire face of the light-emitting area of each sub-pixel. Accordingly, the second ashing stop film 290 may serve as an auxiliary capacitor S-Cst that increases a capacitance of the storage capacitor Cst as the first electrode 298 and the transparent electrode 286 are disposed with the insulating pattern 288 interposed therebetween to constitute the capacitor.

Since the second ashing stop film 290 is located on the entire face of the light-emitting area EA, as an area of the auxiliary capacitor S-Cst is also added in the same manner, a total area occupied by the capacitor is increased, thereby increasing the capacitance. For example, when the second ashing stop film 290 is constructed as the auxiliary capacitor S-Cst, the capacitance may increase by at least 20% compared to that of a case in which only the storage capacitor Cst is disposed. As such, as the capacitance is increased, the light emission of the sub-pixel may be stably maintained.

A second planarization film 292 including a micro lens array 297 is positioned on the first planarization film 280 on which the ashing stop films 289 and 290 are formed. The second planarization film 292 is formed to cover the second ashing stop film 290 while exposing the first ashing stop film 289.

The micro lens array 297 may include a plurality of micro lens patterns 297a, 297b, and 297c. The micro lens array 297 may be positioned to overlap the light-emitting area EA (see FIG. 3) of each of the sub-pixels SP_R, SP_W, SP_B, and SP_G. The micro lens patterns 297a, 297b, and 297c may include at least one concave portion 296. A space s for separating two adjacent concave portions 296 from each other by a predefined spacing may be defined. The micro lens patterns 297a, 297b, and 297c may be formed to have a hexagonal shape in a plan view, but the present disclosure may not be limited thereto. In the plan view of the micro lens array 297, hexagonal patterns may be arranged to have a honeycomb structure. The concave portions 296 of the micro lens patterns 297a, 297b, and 297c may have the same depth.

The first electrode 298 is disposed on the second planarization film 292. The first electrode 298 is in contact with the exposed portion of the transparent electrode 286 of the first ashing stop film 289 to be electrically connected to the drain electrode DE. The first electrode 298 extends from the first ashing stop film 289 along a shape of the concave portions 296 of the micro lens patterns 297a, 297b, and 297c. Accordingly, the first electrode 298 has a concave shape at the concave portions 296 of the micro lens patterns 297a, 297b, and 297c. The first electrode 298 contains the transparent metal oxide such as the indium-tin-oxide (ITO) or the indium-zinc-oxide (IZO).

A bank 300 having a bank hole 305 defined therein is disposed on the first electrode 298. The bank 300 as a boundary area that defines the light-emitting area EA of an area where the pixel is to be formed serves to separate the sub-pixels SP_R, SP_W, SP_B, and SP_G from each other.

An organic light-emitting layer 310 and a second electrode 315 are formed on the light-emitting area EA. Accordingly, an organic light-emitting element (OLED) composed of the first electrode 298, the organic light-emitting layer 310, and the second electrode 315 may be constructed. The organic light-emitting layer 310 is formed to be in direct contact with the first electrode 298 exposed by the bank hole 305, and the second electrode 315 covers an entirety of an exposed face of the organic light-emitting layer 315. Accordingly, the organic light-emitting layer 310 and the second electrode 315 have a concave shape at the concave portions 296 of the micro lens patterns 297a, 297b, and 297c.

As shown in FIG. 1, in the case in which a portion where the micro lens array 165 is located is composed only of the first planarization film 160, as there is no portion to support the portion where the micro lens array 165 is located from the below, the concave portions 162 or the convex portions 164 of the micro lens array 165 may not be easily formed to have the uniform vertical dimension, so that the vertical dimension of the concave portions 162 or the convex portions 164 of the micro lens array 165 may be non-uniform. In addition, as shown in FIG. 2, the stain defect A may occur due to the micro lens array 165 having such a non-uniform vertical dimension.

In this regard, the micro lens array 297 according to the second embodiment of the present disclosure may uniformly maintain the vertical dimension of the concave portions 296 of the micro lens patterns 297a, 297b, and 297c as the second ashing stop film 290 is positioned on the first planarization film 280. Accordingly, as a smooth image may be transmitted without the stain defect in the display area, the reliability of the display device may be secured. Further, the micro lens array 297 may increase an external light-emitting efficiency via multiple reflection via the plurality of micro lens patterns 297a, 297b, and 297c to achieve a maximum external light extraction efficiency.

Further, as the second ashing stop film 290 located on the entire face of the light-emitting area EA serves as the auxiliary capacitor S-Cst, an opening ratio may be secured by reducing the area occupied by the storage capacitor Cst in the circuit area. For example, as the second ashing stop film 290 is located on the entire face of the light-emitting area EA, as the area of the auxiliary capacitor S-Cst is also added in the same manner, while the area in the circuit area occupied by the storage capacitor Cst in the sub-pixel may be reduced, the total area occupied by the capacitor may be increased to increase the capacitance, thereby stably maintaining the light emission of the sub-pixel may be stably maintained.

Hereinafter, a method for manufacturing the display device according to the second embodiment of the present disclosure will be described with reference to the drawings.

FIGS. 5A to 5J are diagrams for illustrating a method for manufacturing a display device according to a second embodiment of the present disclosure.

Figure 5A:
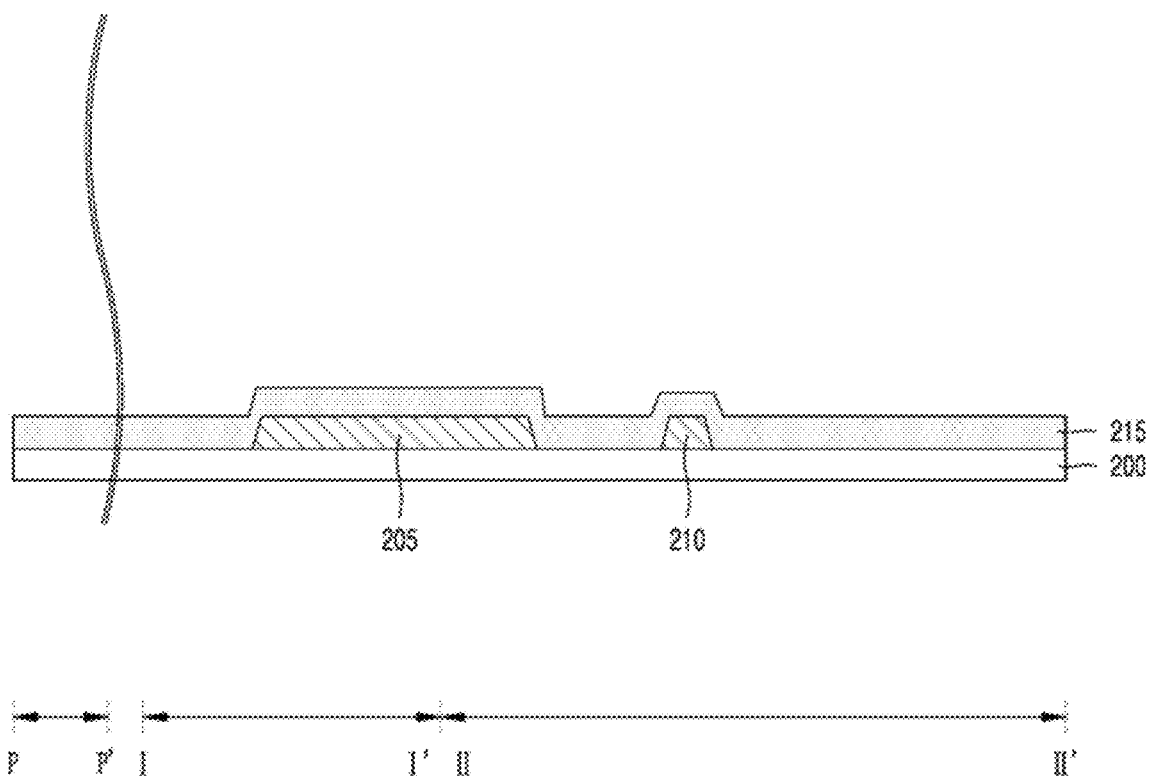
FIGS. 5A to 5J are drawings for illustrating a method for manufacturing a display device according to the second embodiment of the present disclosure.

Referring to FIG. 5A, the light-blocking layer 205 and the first storage electrode 210 are formed on the substrate 200.

Specifically, a metal layer is formed on the substrate 200, and a photolithography process and an etching process using a mask are performed on the metal layer to form the light-blocking layer 205 and the first storage electrode 210. In this regard, the light-blocking layer 205 is formed at a position overlapping an active layer of a thin-film transistor to be formed later. The light-blocking layer 205 serves to protect the thin-film transistor from light incident from the outside.

The substrate 200 may be a flat plate made of an insulating material. For example, the substrate 200 may be made of a hard material such as glass or tempered glass or may be made of a flexible material such as a plastic material, but the present disclosure may not be limited thereto.

The light-blocking layer 205 and the first storage electrode 210 may be formed on the same plane using the same material. In one example, the light-blocking layer 205 or the first storage electrode 210 may have a single layer or stacked structure of one selected from a group of opaque metal materials such as molybdenum (Mo), aluminum (Al), titanium (Ti), and copper (Cu) or an alloy of the opaque metal materials.

Subsequently, the buffer layer 215 is formed on the substrate 200 on which the light-blocking layer 205 and the first storage electrode 210 are formed. The buffer layer 215 is formed to have a thickness to cover exposed faces of the light-blocking layer 205 and the first storage electrode 210.

The buffer layer 215 blocks or at least reduces penetration of moisture or oxygen from the substrate 200 toward the organic light-emitting element to be formed thereon, and protects the thin-film transistor to be subsequently formed from impurities. Further, the buffer layer 215 serves to insulate the light-blocking layer 205 and the first storage electrode 210. To this end, the buffer layer 215 may contain the inorganic insulating material such as the silicon oxide (SiOx) or the silicon nitride (SiNx).

Figure 5B:
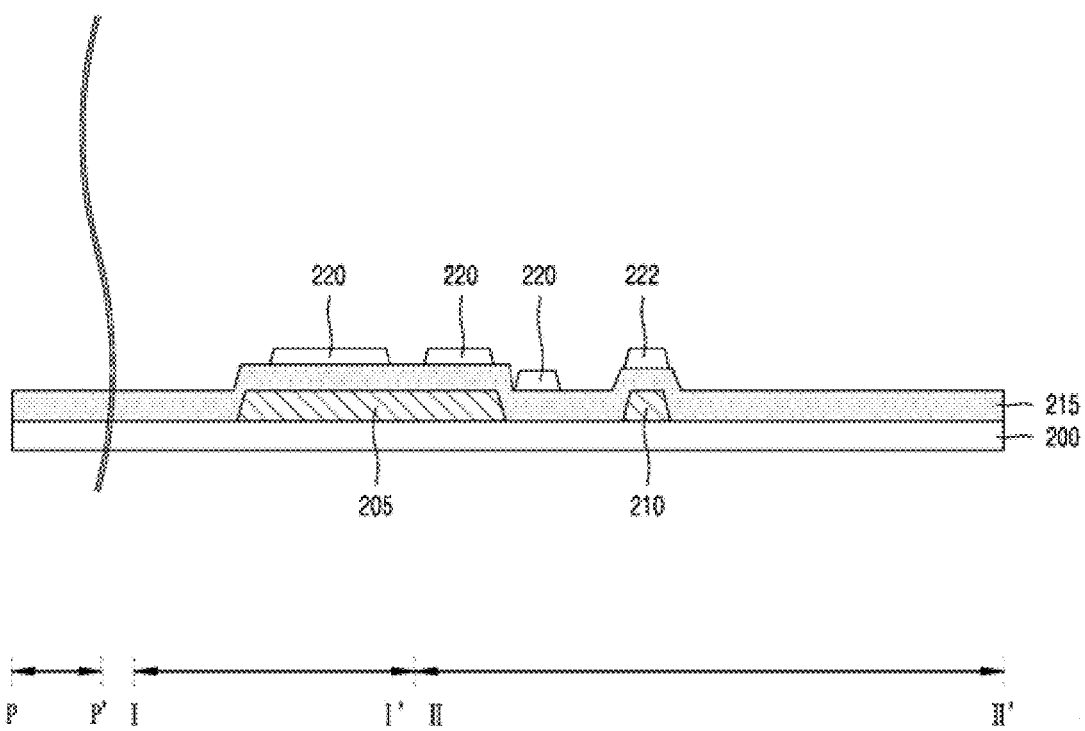

Referring to FIG. 5B, the active layer 220 and a second storage electrode 222 are formed on the buffer layer 215. To this end, a semiconductor layer may be formed on the buffer layer and the active layer 220 and the second storage electrode 222 may be formed by performing the photolithography process and the etching process using the photomask. The active layer 220 may be formed to contain an amorphous silicon, a polycrystalline silicon, or an oxide semiconductor. The second storage electrode 222 may be formed on the same plane as the active layer 220 and may be made of the same material as that of the active layer 220.

Figure 5C:
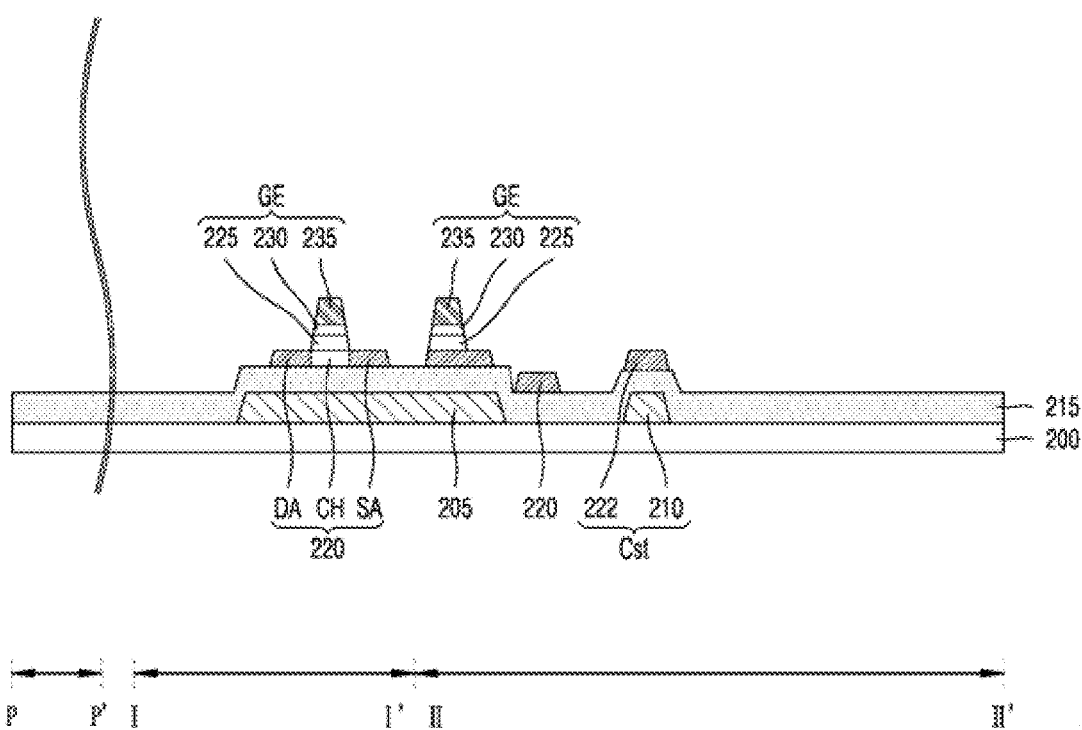

Referring to FIG. 5C, the gate electrode GE is formed on the active layer 220. To this end, the gate insulating layer 225 and the gate metal layers 230 and 235 are formed on the substrate 200 on which the active layer 220 and the second storage electrode 222 in FIG. 4 are formed. The gate metal layers 230 and 235 may be formed in a structure in which the first gate metal layer 230 and the second gate metal layer 235 are stacked. The gate insulating layer 225 may be formed to contain the silicon oxide ($SiO_2$).

In one example, each of the first gate metal layer 230 and the second gate metal layer 235 may include molybdenum (Mo), aluminum (Al), chromium (Cr), gold (Au), titanium (Ti), nickel (Ni), neodymium (Nd), and copper (Cu) or an alloy thereof.

Next, as the gate metal layers 230 and 235 and the gate insulating layer 225 are patterned, the gate electrode GE overlapping the gate insulating layer 225 is formed. In this regard, the etching process may be performed as a dry etching scheme.

In one example, while performing the dry etching to form the gate electrode GE, the active layer 220 and the second storage electrode 222 may become conductive. Specifically, while the gate insulating layer 225 remains in a portion overlapping the gate electrode GE, the gate insulating layer 225 is also removed in an area not covered by the gate electrode GE to expose surfaces of the active layer 220 and the second storage electrode 222.

A conductivity of an oxide semiconductor varies depending on an oxygen content. For example, as the content of oxygen is reduced, a metallicity is strengthened, and thus the oxide semiconductor has the conductivity. When the dry etching process is performed using plasma to take advantage of such characteristics of the oxide semiconductor, as the oxygen contained in the oxide semiconductor is removed by plasma treatment and the oxygen content is reduced, the oxide semiconductor may become conductive while a resistance thereof is lowered. In other words, an etching gas used in the dry etching comes into contact with the exposed active layer 220 and the second storage electrode 222 to form conductive areas.

The conductive areas of the active layer 220 may include the source area SA, the drain area DA, and a storage upper electrode 235. In addition, the channel area CH may be disposed in an area of the active layer 220 beneath the gate electrode GE where the conductive area is not formed. The conductive area has a lower resistivity than the channel area CH, and thus has a high electrical conductivity, thereby having the electrical conductivity of a level similar to that of a conductor.

Further, as the second storage electrode 222 becomes conductive, the storage capacitor Cst in which the first storage electrode 210 and the second storage electrode 222 overlap with each other with the buffer layer 215 interposed therebetween is formed.

Figure 5D:
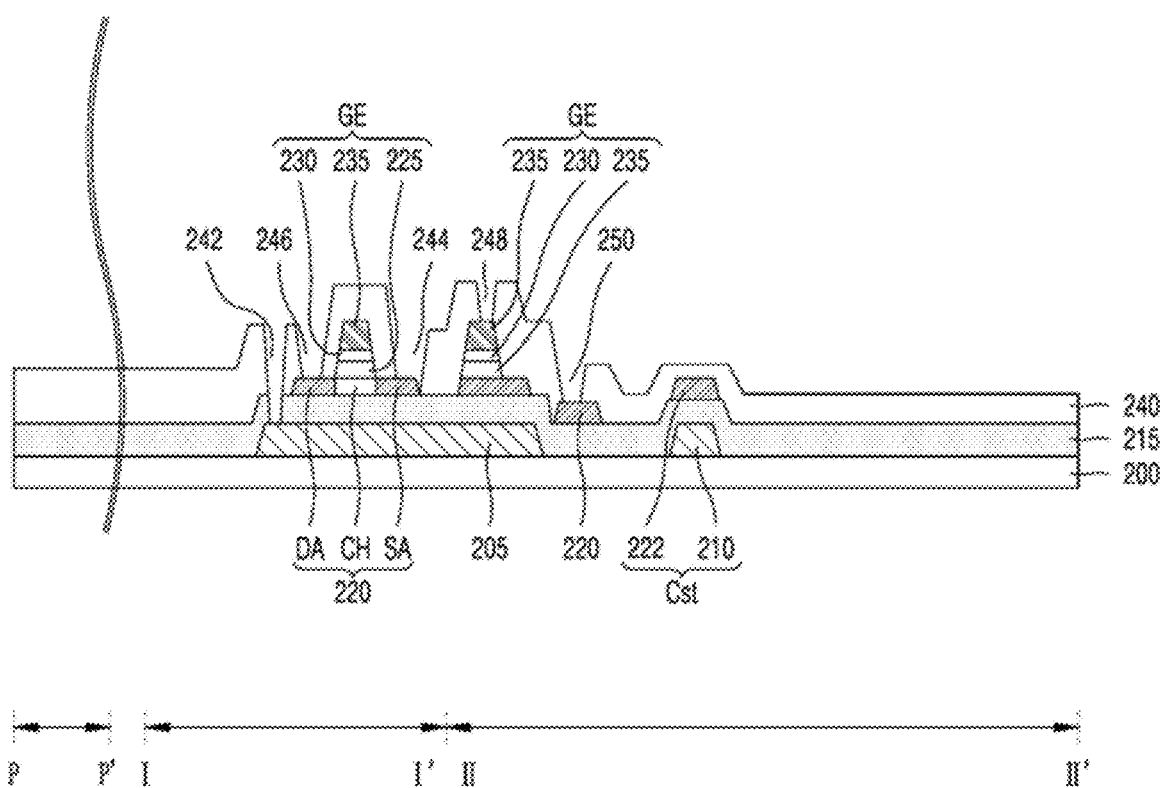

Referring to FIG. 5D, an interlayer insulating film 240 having a plurality of contact holes 242, 244, 246, 248, and 250 defined therein is formed. To this end, the interlayer insulating film 240 is formed on the substrate 200 on which the gate electrode GE is formed. Then, a patterning process is performed on the interlayer insulating film 240 to define the plurality of contact holes in the interlayer insulating film 240.

The plurality of contact holes 242, 244, 246, 248, and 250 may include a light-blocking contact hole 242 that exposes the surface of the light-blocking layer 205, a source contact hole 244 that exposes the source area SA of the active layer 220, and a drain contact hole 246 that exposes the drain area DA. Further, the plurality of contact holes 242, 244, 246, 248, and 250 may include lower contact holes 248 and 250 for connecting the auxiliary capacitor to be formed later in the pixel area and the gate electrode GE to each other at a location below the lower contact holes 248 and 250. In this regard, the lower contact holes 248 and 250 include a first lower contact hole 248 that exposes a portion of a surface of the gate electrode GE and a second lower contact hole 250 that exposes a portion of a surface of the active layer 220.

Figure 5E:
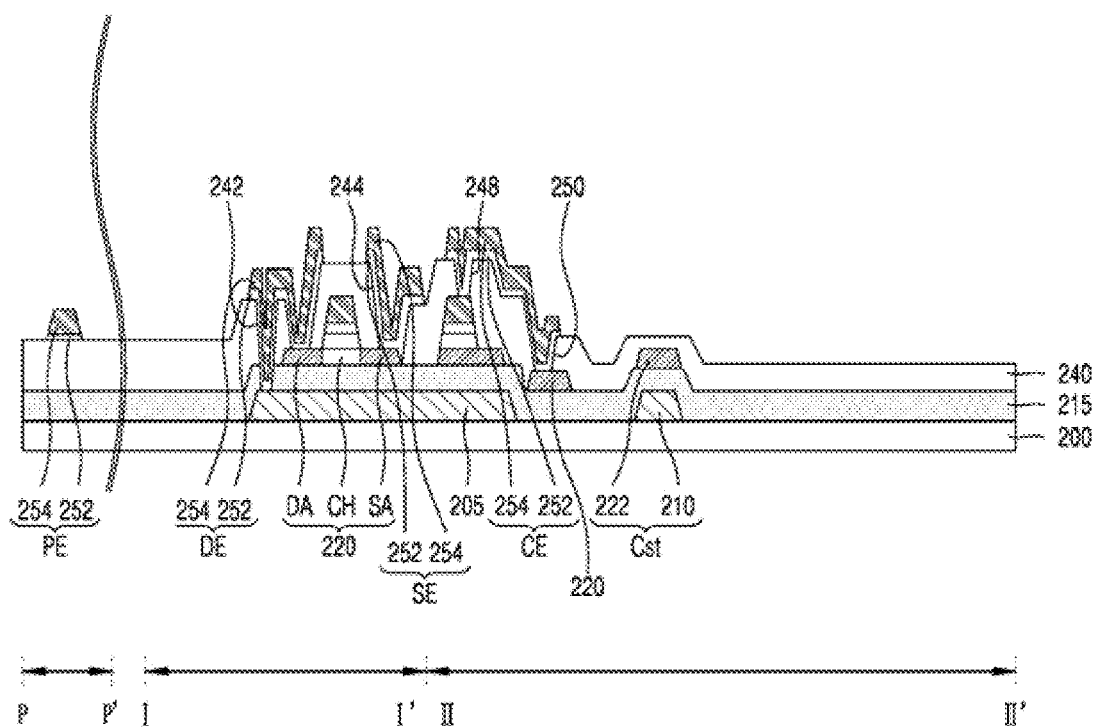

Referring to FIG. 5E, the source electrode SE, the drain electrode DE, an auxiliary capacitor connection electrode CE, and the pad electrode PE are formed on the substrate 200.

The metal layers 252 and 254 are formed on the substrate 200 on which the interlayer insulating film 240 having the plurality of contact holes 242, 244, 246, 248, and 250 defined therein is formed. The metal layers 252 and 254 may be formed in a structure in which the first metal layer 252 and the second metal layer 254 are stacked. In one example, each of the first metal layer 252 and the second metal layer 254 may include molybdenum (Mo), aluminum (Al), chromium (Cr), gold (Au), titanium (Ti), nickel (Ni), neodymium (Nd), and copper (Cu) or an alloy thereof.

Then, the metal layers 252 and 254 are patterned to form the source electrode SE, the drain electrode DE, the auxiliary capacitor connection electrode CE, and the pad electrode PE. In this regard, the etching process may be performed as the dry etching scheme. As the source electrode SE, the drain electrode DE, the auxiliary capacitor connection electrode CE, and the pad electrode PE are formed by patterning the same metal layers 252 and 254, the source electrode SE, the drain electrode DE, the auxiliary capacitor connection electrode CE, and the pad electrode PE may be made of the same material and may be formed on the same planar layer. In this regard, the auxiliary capacitor connection electrode CE may electrically connect the gate electrode GE and the active layer 220 to each other while filling the first lower contact hole 248 and the second lower contact hole 250.

Figure 5F:
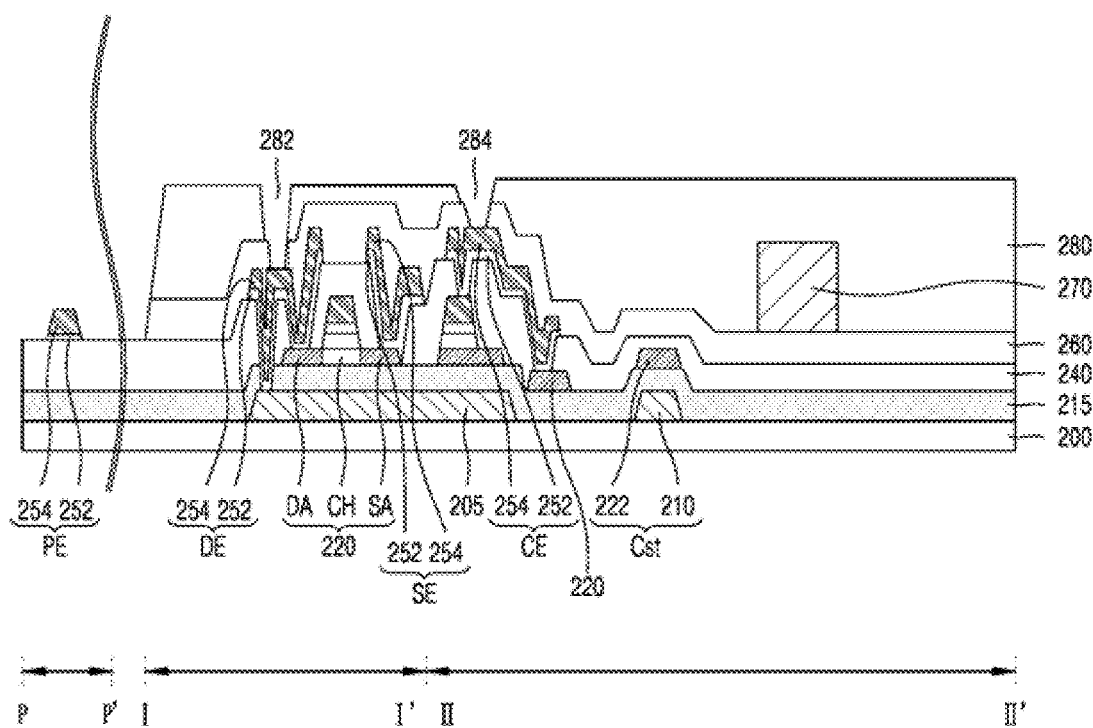

Referring to FIG. 5F, the protective layer 260 is formed on the substrate 200. The protective layer 260 is formed to have a thickness sufficient to cover all surfaces of the source electrode SE, the drain electrode DE, the auxiliary capacitor connection electrode CE, and the pad electrode PE. In this regard, the protective layer 260 may not be formed in a pad area P-P' where the pad electrode PE is formed. The protective layer 260 may be made of the inorganic insulating material such as the silicon nitride (SiNx) or the silicon oxide (SiOx).

Then, the color filter 270 is formed on the protective layer 260. The color filter 270 may be formed to correspond to the light-emitting area by applying each of red (R), green (G), and blue (B) pigments on the protective layer 260 and performing a mask process. When the color filters 270 have the colors of red (R), green (G), and blue (B), at least three mask processes may be required.

Subsequently, the first planarization film 280 is formed on the protective layer 260 on which the color filter 270 is disposed. The first planarization film 280 may be formed to have a thickness sufficient to have a flat surface on the substrate 200 while protecting the underlying elements. The first planarization film 280 may be formed by applying an organic insulating material such as an acrylic resin. Then, the first planarization film 280 and the protective layer 260 are patterned to form the pixel contact hole 282 that exposes a portion of the surface of the drain electrode DE and the auxiliary capacitor contact hole 284 that exposes a portion of the surface of the auxiliary capacitor connection electrode CE. The patterning process for defining the pixel contact hole 282 and the auxiliary capacitor contact hole 284 may be performed in a wet etching scheme.

Figure 5G:
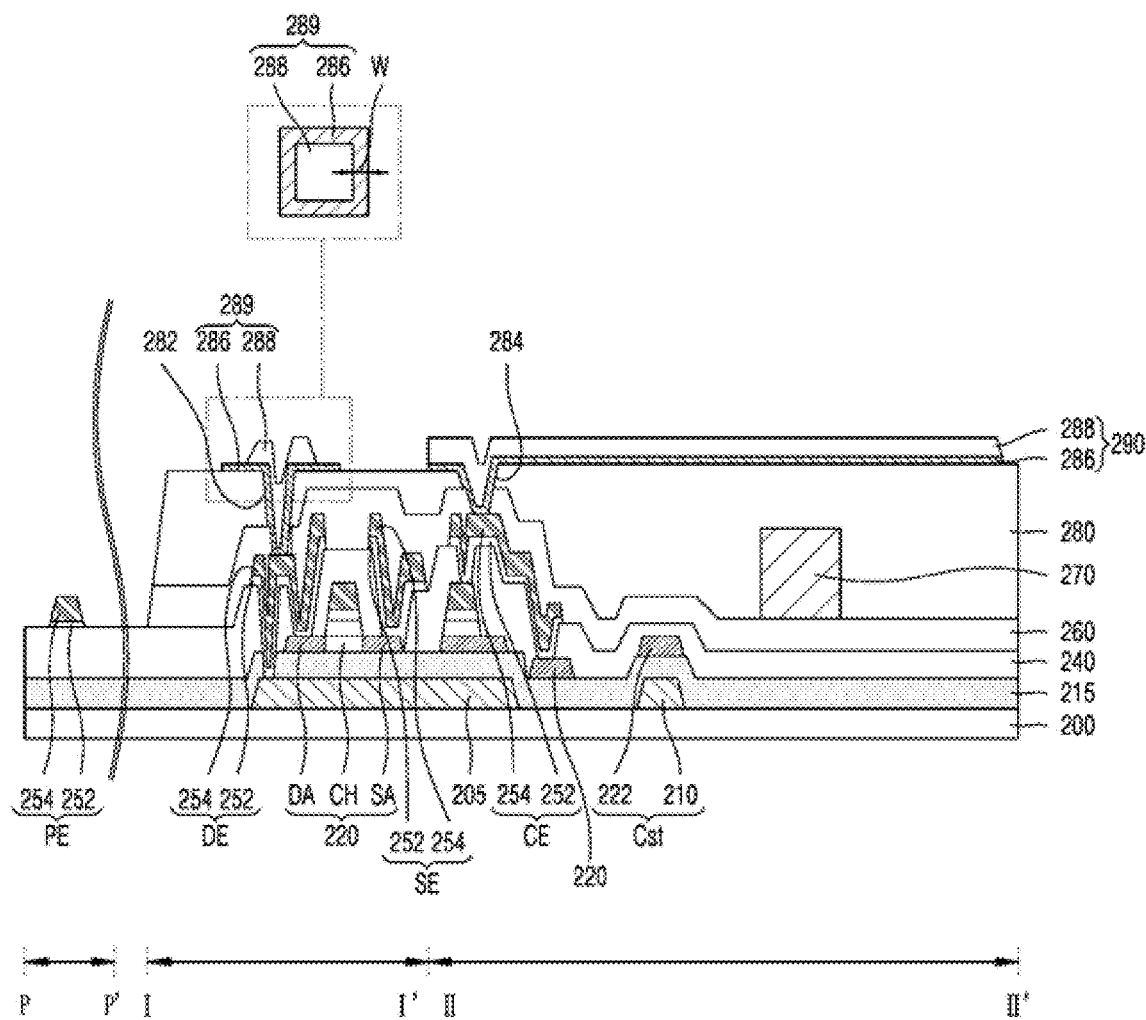

Referring to FIG. 5G, the ashing stop films 289 and 290 are formed on the first planarization film 280 having the pixel contact hole 282 and the auxiliary capacitor contact hole 284 defined therein.

The ashing stop films 289 and 290 serve to limit positions where the etching is stopped such that the vertical dimension of the plurality of micro lens patterns may be uniform in the process of forming the micro lens patterns thereafter.

The ashing stop films 289 and 290 may include the first ashing stop film 289 that fills the pixel contact hole 282 and the second ashing stop film 290 that fills the auxiliary capacitor contact hole 284. The ashing stop films 289 and 290 may be formed in a structure in which the transparent electrode 286 and the insulating pattern 288 are sequentially stacked. In one example, the transparent electrode 286 may be made of the transparent metal oxide such as the indium-tin-oxide (ITO) or the indium-zinc-oxide (IZO). Further, the insulating pattern 288 may be made of the inorganic insulating material such as the silicon oxide (SiOx).

The transparent electrode 286 of the first ashing stop film 289 is formed along an exposed face of the pixel contact hole 282. The insulating pattern 288 of the first ashing stop film 289 may be formed on the transparent electrode 286, and may be formed to extend to a surface of the first planarization film 280 while filling the pixel contact hole 282. In this regard, the transparent electrode 286 of the first ashing stop film 289 extends longer on the surface of the first planarization film 280 than the insulating pattern 288 of the first ashing stop film 289, so that a portion of a surface thereof is exposed by a first length w.

In addition, the transparent electrode 286 of the second ashing stop film 290 may be formed along a shape of the exposed face of the auxiliary capacitor contact hole 284 and may extend on the surface of the first planarization film 280. The insulating pattern 288 of the second ashing stop film 290 may be formed to be in contact with the transparent electrode 286 of the second ashing stop film 290, and may be formed to extend on the surface of the first planarization film 280 while filling the auxiliary capacitor contact hole 284. The second ashing stop film 290 may be formed to extend to the area in which the color filter 270 is disposed, and, for example, may be formed on an entire face of an area where the light-emitting area is to be formed.

Figure 5H:
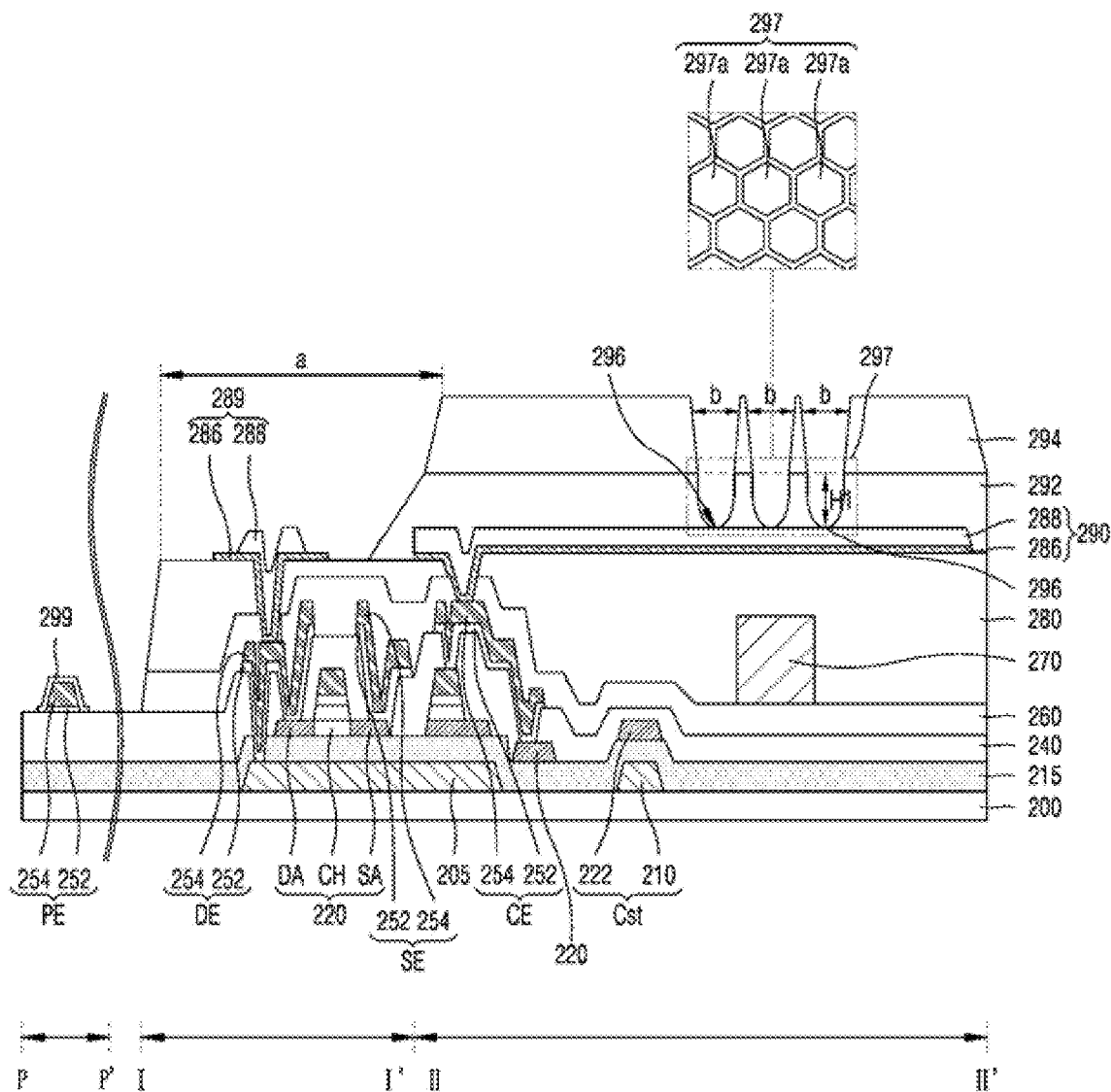

Referring to FIG. 5H, the second planarization film 292 is formed on the first planarization film 280 on which the ashing stop films 289 and 290 are formed. The second planarization film 292 may be made of the same material as that of the first planarization film 280. For example, the second planarization film 292 may be formed by applying the organic insulating material such as the acrylic resin. The second planarization film 292 is formed to have a thickness to have a flat surface on the ashing stop films 289 and 290.

Subsequently, a photoresist pattern 294 is formed on the second planarization film 292. Specifically, a photoresist film is applied on the second planarization film 292. Then, the exposure process of selectively irradiating light onto the photoresist film via the photomask and the development process of removing the photoresist film denatured by the exposure process are performed to form the photoresist pattern 294. Then, the photoresist pattern 294 having a first open area and a second open area b is formed. In this regard, the first open area a exposes a surface of the second planarization film 292 in an area where the first ashing stop film 289 is formed, and the second open area b defines an area where the micro lens pattern is to be formed.

Then, a patterning process using the photoresist pattern 294 as an etching mask is performed to form the micro lens array 297. The patterning process may be performed in the dry etching scheme. As the dry etching process proceeds at the same etching speed in a vertical direction, the second planarization film 292 may be etched in the same shape as a shape of the second open area b of the photoresist pattern 294 to form the micro lens array 297. The micro lens array 297 may include a plurality of micro lens patterns 297a, 297b, 297c . . . 297m (m is a natural number). In an embodiment of the present disclosure, only three micro lens patterns 297a, 297b, and 297c are illustrated for convenience of description, but the present disclosure is not limited thereto. The micro lens array 297 may be formed to overlap with a sub-pixel area to be formed later and the color filter 270.

The micro lens patterns 297a, 297b, and 297c may include at least one concave portion 296. The space for separating the two adjacent concave portions 296 from each other by the predefined spacing may be included.

Each of the micro lens patterns 297a, 297b, and 297c may be formed to have a polygonal shape in a plan view. Referring to a portion showing the micro lens array 297 in an enlarged manner in the plan view in FIG. 5H, the micro lens patterns 297a, 297b, and 297c may be formed to have a hexagonal shape in the plan view, but the present disclosure is not limited thereto. In one example, the micro lens patterns 297a, 297b, and 297c may be formed to have various shapes such as a square shape or an elliptical shape. In the plan view, the micro lens array 297 may have hexagonal patterns arranged to have a honeycomb structure.

The concave portions 296 of the respective micro lens patterns 297a, 297b, and 297c have the same depth H1. The second ashing stop film 290 is disposed beneath the second planarization film 292. In other words, the second ashing stop film 290 is located between the first planarization film 280 and the second planarization film 292. As the second ashing stop film 290 acts as an etching stop film that prevents or at least reduces excessive etching beyond the predetermined depth H1, the depth H1 of the concave portions 296 disposed in the respective micro lens patterns 297a, 297b, and 297c may be uniformly maintained.

Further, the surface of the first ashing stop film 289 may be exposed by etching the second planarization film 292 exposed by the first open area a of the photoresist pattern 294. In addition, the photoresist pattern 294 is removed via a strip process.

Figure 5I:
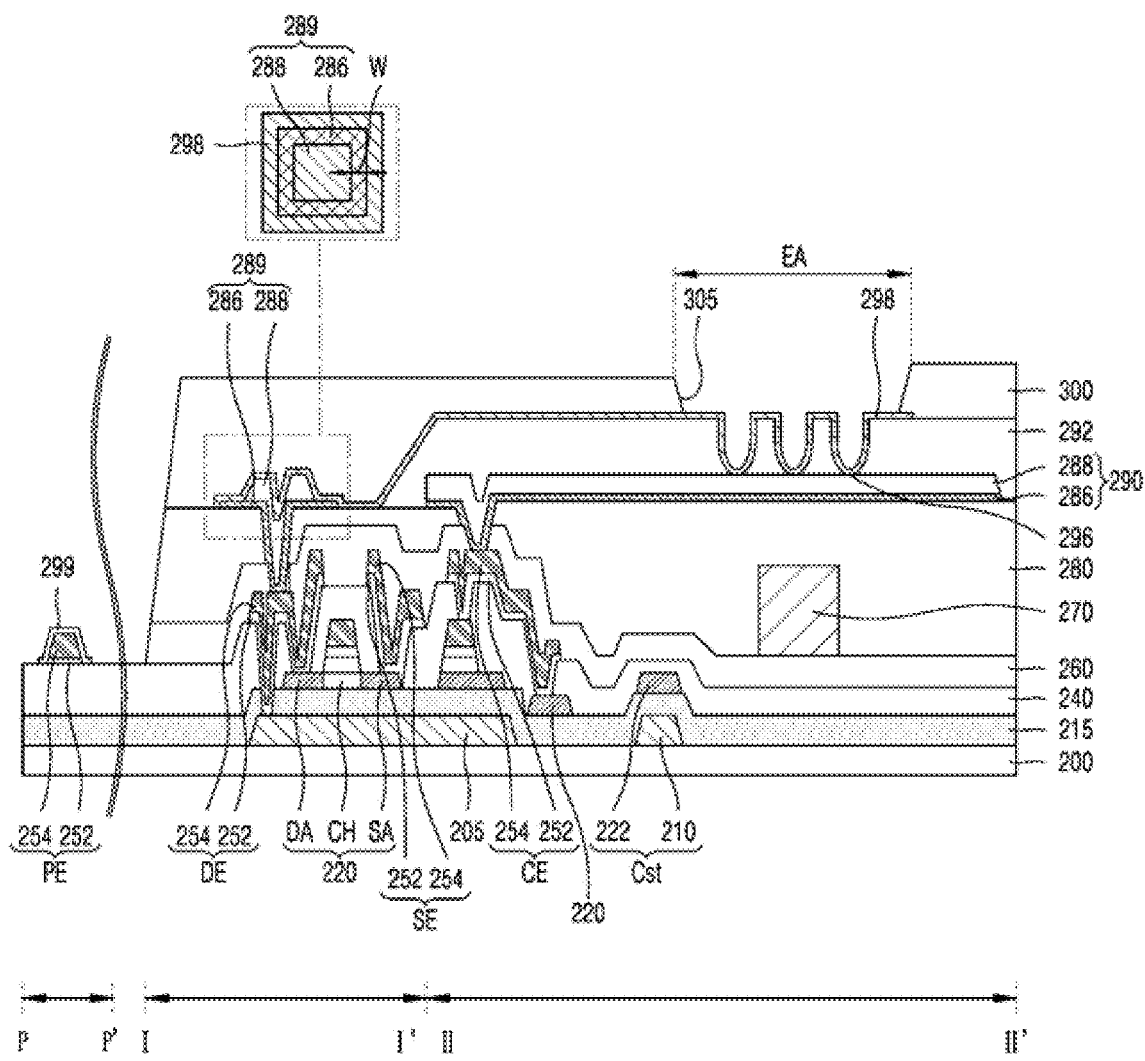

Referring to FIG. 5I, the first electrode 298 is formed on the second planarization film 292, and the bank 300 having the bank hole 305 defined therein for exposing the portion of the surface of the first electrode 298 is formed.

The first electrode 298 is in contact with the exposed portion of the transparent electrode 286 of the first ashing stop film 289 filling the pixel contact hole 282. In this regard, the transparent electrode 286 of the first ashing stop film 289 extends longer on the surface of the first planarization film 280 than the insulating pattern 288 of the first ashing stop film 289, so that the portion of the surface thereof is exposed by the first length w. In addition, the first electrode 298 may be formed while covering the transparent electrode 286 of the first ashing stop film 289 exposed by the first length w. The first electrode 298 may extend from the first ashing stop film 289 and be formed along the shapes of the concave portions 296 of the micro lens patterns 297a, 297b, and 297c. Accordingly, the first electrode 298 has a concave shape at the concave portions 296 of the micro lens patterns 297a, 297b, and 297c.

The first electrode 298 may be electrically connected to the drain electrode DE and the gate electrode GE via the transparent electrode 286 of the first ashing stop film 289. In one example, the first electrode 298 may be formed to contain the same material as that of the transparent electrode 286. The first electrode 298 may be referred to as an anode electrode or a pixel electrode. In one example, the first electrode 298 may be formed as a pad cover electrode 299 that prevents or at least reduces corrosion of the pad electrode PE by covering the exposed face of the pad electrode PE disposed in the pad area P-P'.

The bank 300 having the bank hole 305 defined therein is disposed on the second planarization film 292 on which the first electrode 298 is formed. The bank 300 as a boundary area that defines the light-emitting area EA of the area where the pixel is to be formed serves to separate the sub-pixels from each other. The bank 300 may be formed using the inorganic insulating material such as the silicon nitride (SiNx) or the silicon oxide (SiOx) or an organic insulating material such as polyimide. The bank 300 may be formed so as to cover the remaining area excluding the exposed portion of the first electrode 298 in the light-emitting area EA defined by the bank hole 305.

The bank hole 305 exposes the micro lens patterns 297a, 297b, and 297c. Accordingly, the micro lens patterns 297a, 297b, and 297c may be positioned to overlap the light-emitting area EA. The bank 300 may be formed in an area excluding the pad area P-P' so as not to cover the pad electrode PE covered with the pad cover electrode 299.

Figure 5J:
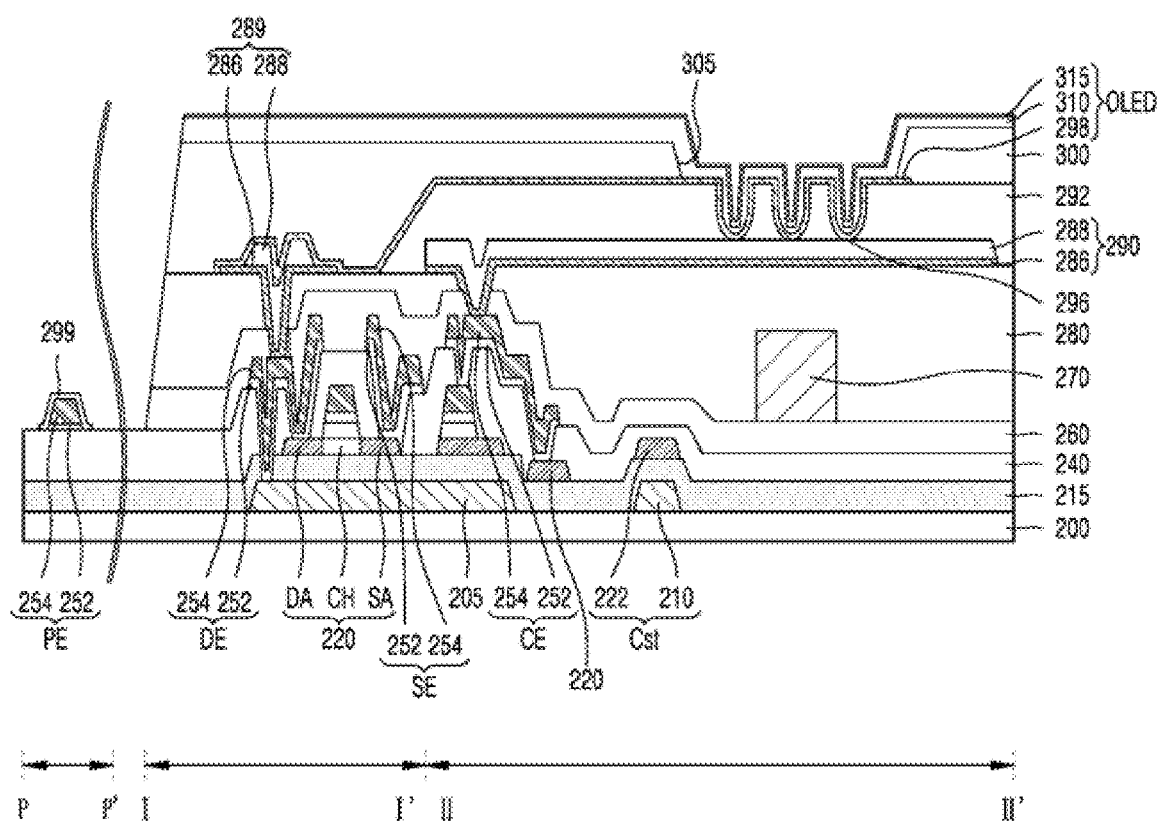

Referring to FIG. 5J, the organic light-emitting layer 310 and the second electrode 315 are formed on the light-emitting area EA defined by the bank hole 305. Accordingly, an organic light-emitting element (OLED) composed of the first electrode 298, the organic light-emitting layer 310, and the second electrode 315 may be constructed. The organic light-emitting layer 310 and the second electrode 315 may be formed in the area excluding the pad area P-P'.

The organic light-emitting layer 310 is formed to be in direct contact with the first electrode 298 exposed by the bank hole 305. The organic light-emitting layer 310 may be formed to extend on a top face of the bank 300 along an exposed face of the first electrode 298. Accordingly, the organic light-emitting layer 310 has a concave shape at the concave portions 296 of the micro lens patterns 297a, 297b, and 297c. In one example, the organic light-emitting layer 310 may be made of an organic material emitting white light, and may represent a color set by the color filter 270.

The second electrode 315 may be formed to cover an entirety of an exposed face of the organic light-emitting layer 310. The second electrode 315 may be formed as a common electrode commonly in contact with adjacent pixels on the display area and applying a voltage to the adjacent pixels. The second electrode 315 may be referred to as a cathode electrode. In one example, the second electrode 315 may contain a semi-transmissive metal material such as molybdenum (Mo), tungsten (W), silver (Ag), aluminum (Al), and an alloy containing one or more thereof, but the present disclosure may not be limited thereto.

As described above, as the organic light-emitting element (OLED) including the first electrode 298, the organic light-emitting layer 310, and the second electrode 315 is formed along the exposed faces of the micro lens patterns 297a, 297b, and 297c, the organic light-emitting element (OLED) may have a concave shape at the concave portions 296 of the micro lens patterns 297a, 297b, and 297c.

Further, as the concave portions 296 of the micro lens patterns 297a, 297b, and 297c have the same vertical dimension, the uniformity of the micro lens array 297 may be ensured, thereby improving luminance. In one example, the luminance may be improved from 150 nit to 230 nit.

In addition, the second ashing stop film 290 may be formed on the first planarization film 280 and may be formed to extend on the entire face of the light-emitting area of each sub-pixel. Accordingly, as the first electrode 298 and the transparent electrode 286 are disposed with the insulating pattern 288 interposed therebetween to constitute the capacitor, the second ashing stop film 290 may act as the auxiliary capacitor that increases the capacitance of the storage capacitor Cst. As such, as the capacitance is increased, the light emission of the sub-pixel may be stably maintained.

According to the second embodiment of the present disclosure, as the second ashing stop film 290 positioned between the first planarization film 280 and the second planarization film 292 serves as the etching stop film, the plurality of micro lens patterns 297a, 297b, and 297c having the uniform depth may be implemented. Accordingly, the stain defect may be prevented or at least reduced from occurring due to the non-uniform vertical dimension (or depth).

In one example, the capacitance of the storage capacitor may be further increased by constructing the storage electrode constituting the storage capacitor Cst as a triple storage electrode. This will be described with reference to the drawings below.

FIGS. 6A to 6G are diagrams for illustrating a method for manufacturing a display device according to a third embodiment of the present disclosure. In this regard, components the same as or similar to those in FIGS. 5A to 5J will be briefly described. Further, as the process proceeds in the same manner as that in FIGS. 5A to 5D, the description thereof will be omitted, and description will be made from a subsequent operation.

As shown in FIGS. 5A to 5D, the interlayer insulating film 240 having the plurality of contact holes 242, 244, 246, 248, and 250 defined therein is formed on the substrate 200 on which the gate electrode GE is formed.

Figure 6A:
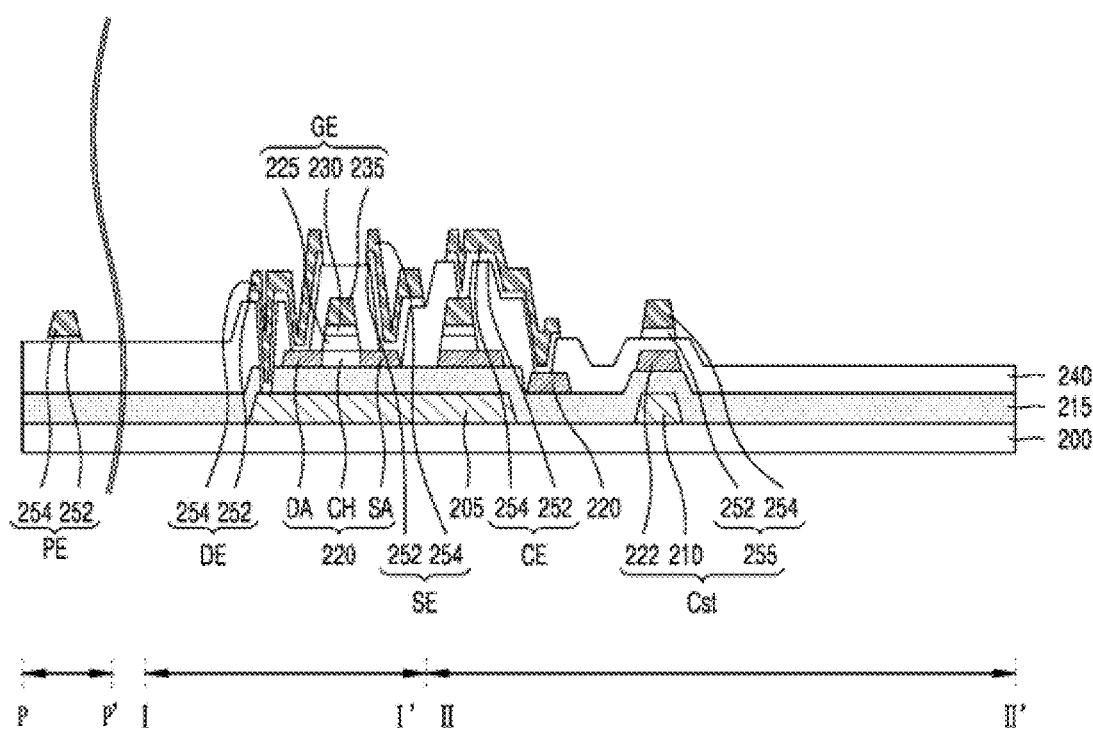
FIGS. 6A to 6F are drawings for illustrating a method for manufacturing a display device according to a third embodiment of the present disclosure.

Then, as shown in FIG. 6A, the source electrode SE, the drain electrode DE, the auxiliary capacitor connection electrode CE, a third storage electrode 255, and the pad electrode PE are formed on the substrate 200. Subsequently, the metal layers 252 and 254 are formed on the substrate 200 on which the interlayer insulating film 240 is formed. The metal layers 252 and 254 may be formed in a structure in which the first metal layer 252 and the second metal layer 254 are stacked.

Then, the metal layers 252 and 254 are patterned to form the source electrode SE, the drain electrode DE, the auxiliary capacitor connection electrode CE, the third storage electrode 255, and the pad electrode PE. As the source electrode SE, the drain electrode DE, the auxiliary capacitor connection electrode CE, the third storage electrode 255, and the pad electrode PE are formed by patterning the same metal layers 252 and 254, the source electrode SE, the drain electrode DE, the auxiliary capacitor connection electrode CE, the third storage electrode 255, and the pad electrode PE may be made of the same material and may be formed on the same planar layer.

Figure 6B:
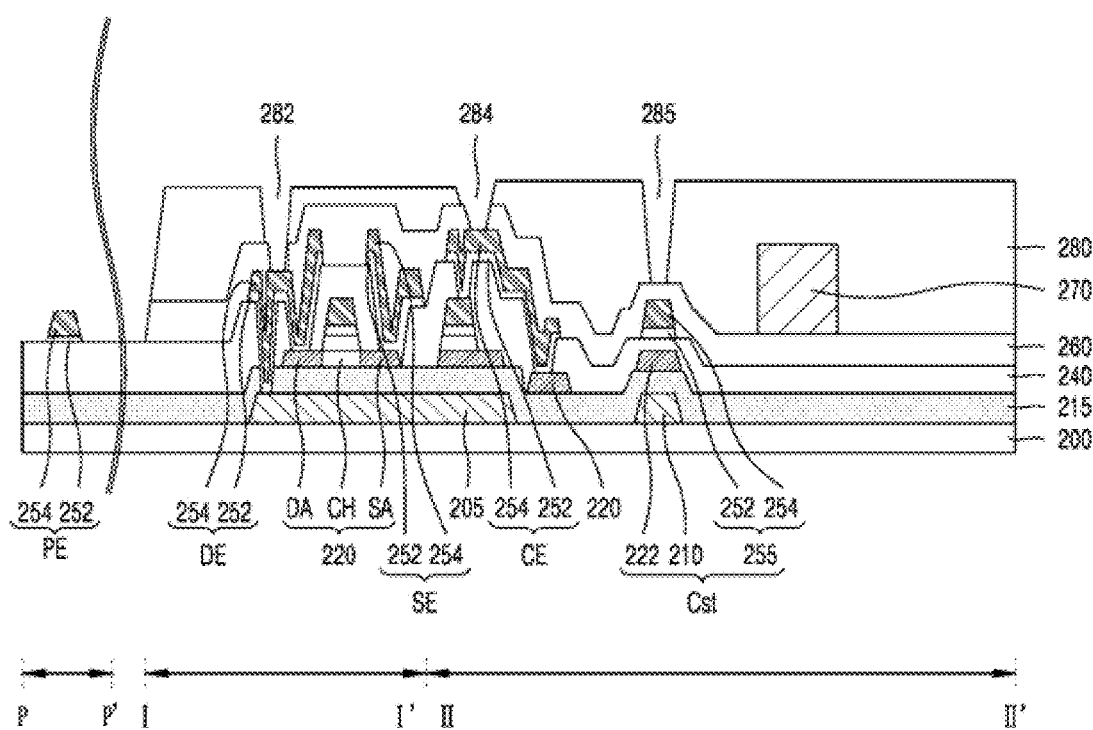

Referring to FIG. 6B, the protective layer 260 is formed on the substrate 200. The protective layer 260 is formed to have a thickness to cover all surfaces of the source electrode SE, the drain electrode DE, the auxiliary capacitor connection electrode CE, the third storage electrode 255, and the pad electrode PE. In this regard, the protective layer 260 may not be formed in the pad area P-P' in which the pad electrode PE is formed.

Then, the color filter 270 is formed on the protective layer 260. The color filter 270 may be formed to correspond to the light-emitting area by applying each of the red (R), green (G), and blue (B) pigments on the protective layer 260 and performing the mask process.

The first planarization film 280 is formed on the protective layer 260 on which the color filter 270 is disposed. The first planarization film 280 may be formed to have the thickness sufficient to have the flat surface on the substrate 200. The first planarization film 280 may be formed by applying the organic insulating material such as the acrylic resin. Then, the first planarization film 280 and the protective layer 260 are patterned to form the pixel contact hole 282 that exposes the portion of the surface of the drain electrode DE, the auxiliary capacitor contact hole 284 that exposes the portion of the surface of the auxiliary capacitor connection electrode CE, and a second auxiliary capacitor contact hole 285 that exposes a portion of a surface of the third storage electrode 255.

Figure 6C:
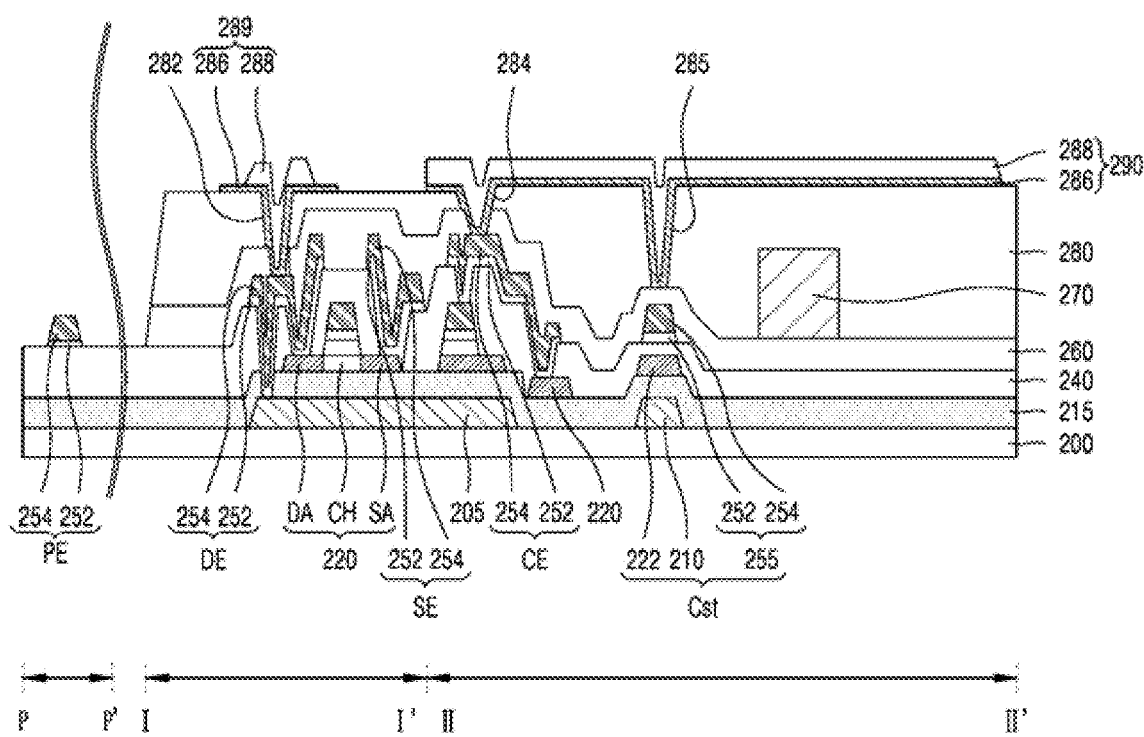

Referring to FIG. 6C, the ashing stop films 289 and 290 are formed on the first planarization film 280 in which the pixel contact hole 282, the first auxiliary capacitor contact hole 284, and the second auxiliary capacitor contact hole 285 are defined.

The ashing stop films 289 and 290 serve to limit the positions where the etching is stopped such that the vertical dimension of the plurality of micro lens patterns may be uniform in the process of forming the micro lens patterns thereafter. The ashing stop film 289 and 290 may include the first ashing stop film 289 and the second ashing stop film 290.

The ashing stop films 289 and 290 may be formed in a structure in which the transparent electrode 286 and the insulating pattern 288 are sequentially stacked. In an example, the transparent electrode 286 may contain the transparent metal oxide such as the indium-tin-oxide (ITO) or the indium-zinc-oxide (IZO), and the insulating pattern 288 may contain the inorganic insulating material such as the silicon oxide (SiOx).

The transparent electrode 286 of the first ashing stop film 289 may be formed along the exposed face of the pixel contact hole 282 and may extend on the transparent electrode 286. In this regard, the transparent electrode 286 of the first ashing stop film 289 may extend longer to the surface of the first planarization film 280 than the insulating pattern 288 of the first ashing stop film 289, so that the portion of the surface thereof may be exposed.

In addition, the second ashing stop film 290 may be formed along the shapes of the exposed faces of the first auxiliary capacitor contact hole 284 and the second auxiliary capacitor contact hole 285 and may be formed to extend on the surface of the first planarization film 280. In this regard, the second ashing stop film 290 may be formed to extend to the area in which the color filter 270 is disposed, and may be, for example, formed to extend to the area in which the light-emitting area is to be formed.

Figure 6D:
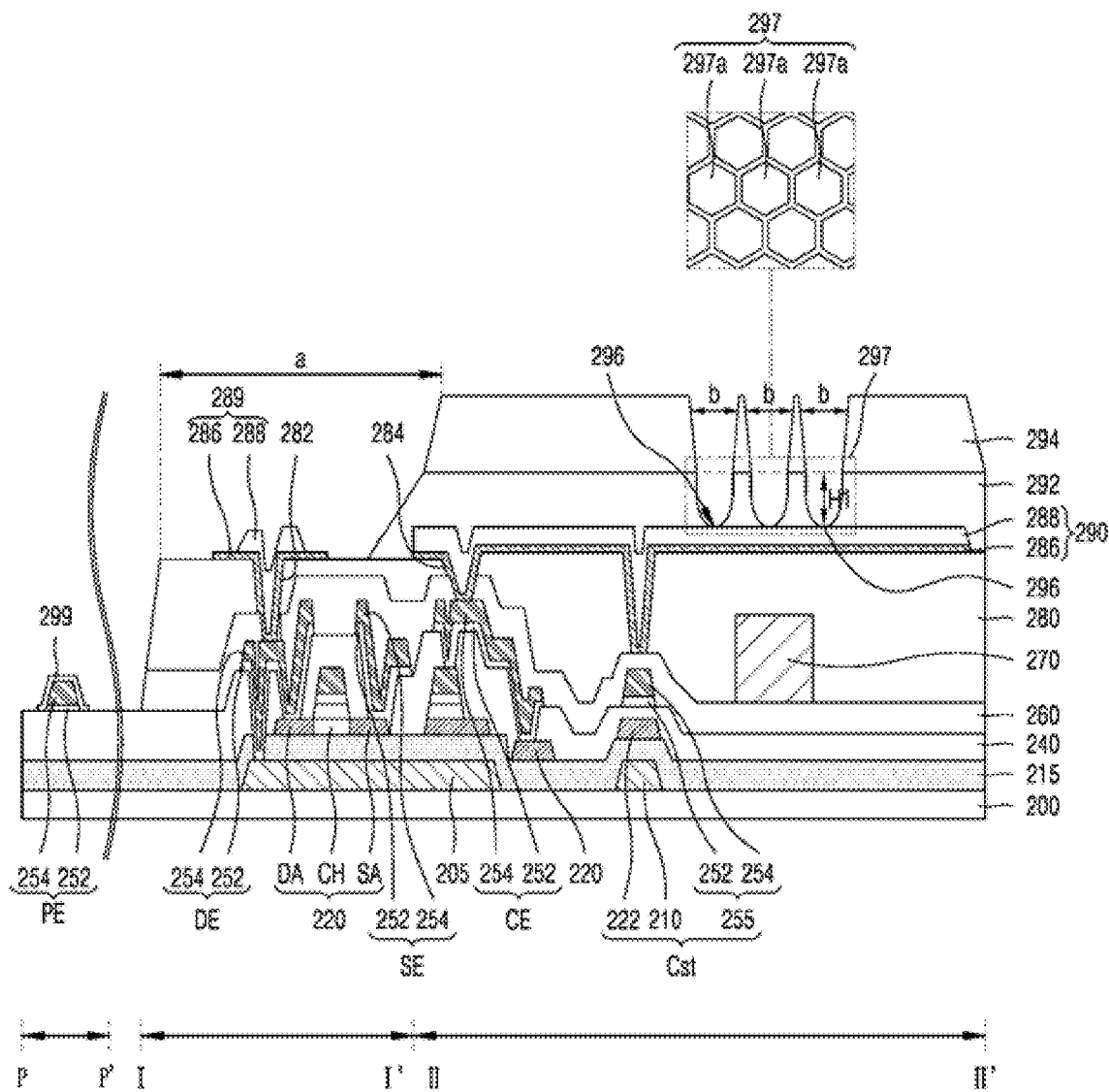

Referring to FIG. 6D, the second planarization film 292 is formed on the first planarization film 280 on which the ashing stop films 289 and 290 are formed. The second planarization film 292 may be made of the same material as that of the first planarization film 280. For example, the second planarization film 292 may be formed by applying the organic insulating material such as the acrylic resin. The second planarization film 292 is formed on the ashing stop films 289 and 290 to have a thickness to have a flat surface.

Subsequently, the photoresist pattern 294 is formed on the second planarization film 292. The photoresist pattern 294 includes the first open area and the second open area b. Then, the micro lens array 297 is formed by etching the second planarization film 292 using the photoresist pattern 294 as the etching mask. The micro lens array 297 includes the plurality of micro lens patterns 297a, 297b, and 297c. The micro lens array 297 may be formed at a position overlapping the sub-pixel area to be formed later.

The micro lens patterns 297a, 297b, 297c include the at least one concave portion 296. Each of the micro lens patterns 297a, 297b, and 297c may be formed to have the hexagonal shape in the plan view, but the present disclosure may not be limited thereto. In one example, in the micro lens array 297, the hexagonal micro lens patterns 297a, 297b, and 297c may be arranged to have the honeycomb structure.

As the second ashing stop film 290 disposed on the first planarization film 280 serves as the etching stop film, the concave portions 296 disposed in the respective micro lens patterns 297a, 297b, and 297c have the same depth H1. The second planarization film 292 exposed by the first open area a of the photoresist pattern 294 may be removed to expose the surface of the first ashing stop film 289. In addition, the photoresist pattern 294 is removed.

Figure 6E:
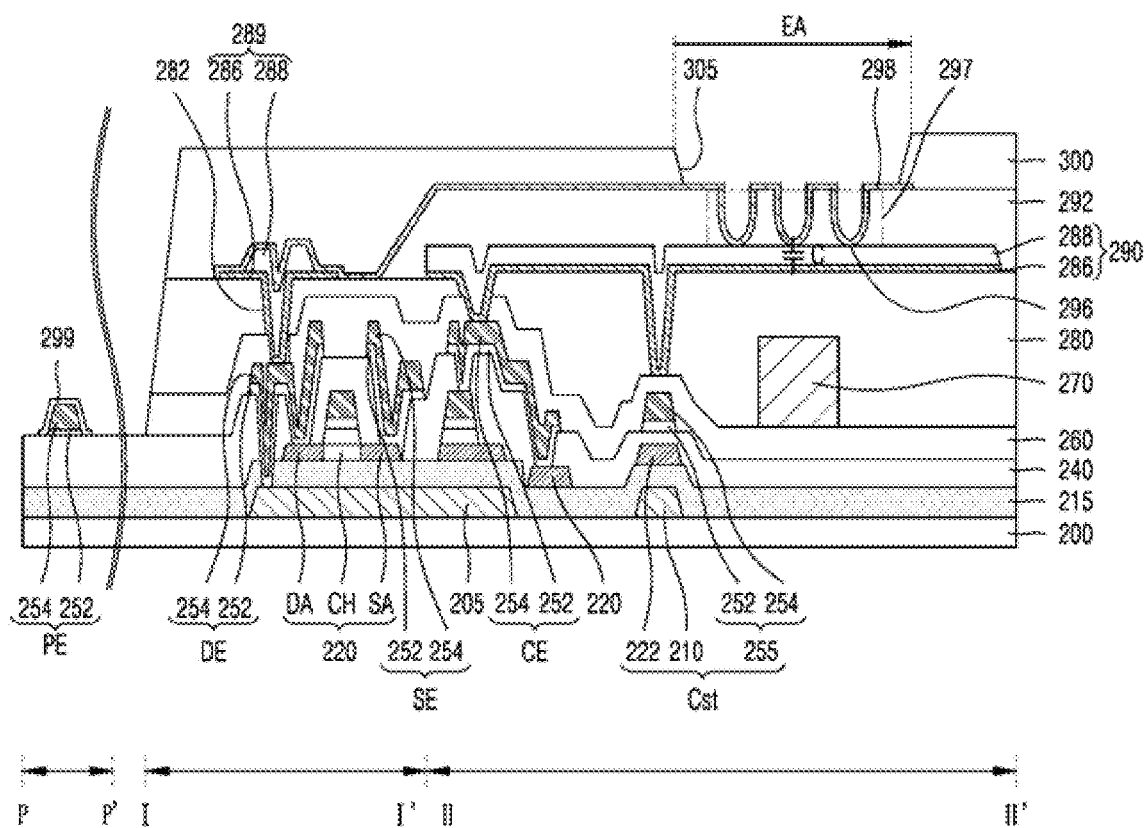

Referring to FIG. 6E, the first electrode 298 is formed on the second planarization film 292, and the bank 300 having the bank hole 305 defined therein is formed.

The first electrode 298 is in contact with the exposed portion of the transparent electrode 286 of the first ashing stop film 289, and extends along the concave portions 296 of the micro lens patterns 297a, 297b, and 297c. Accordingly, the first electrode 298 has the concave shape at the concave portions 296 of the micro lens patterns 297a, 297b, and 297c.

The first electrode 298 is electrically connected to the drain electrode DE and the gate electrode GE via the transparent electrode 286 of the first ashing stop film 289. In one example, the first electrode 298 may be formed to contain the same material as that of the transparent electrode 286. In one example, the first electrode 298 may be formed as the pad cover electrode 299 that covers the exposed face of the pad electrode PE disposed in the pad area P-P'.

As the first electrode 298 is formed along the concave portions 296 of the micro lens patterns 297a, 297b, 297c, an auxiliary capacitor C overlapping the transparent electrode 286 with the insulating pattern 288 of the first ashing stop film 289 interposed therebetween is formed.

Further, the triple storage capacitor Cst in which the first storage electrode 210 and the second storage electrode 222 overlap each other with the buffer layer 215 interposed therebetween, the third storage electrode 255 and the second storage electrode 222 overlap each other with the interlayer insulating film 240 interposed therebetween, and the transparent electrode 286 of the first ashing stop film 289 and the third storage electrode 255 overlap each other with the protective layer 260 interposed therebetween is formed. Accordingly, as the auxiliary capacitor C is added along with the triple storage capacitor Cst, the capacitance may be further increased than in the case in which only the triple storage capacitor Cst is disposed. For example, when the triple storage capacitor Cst and the auxiliary capacitor C are disposed together, the capacitance may be increased by at least 20% than in the case in which only the triple storage capacitor Cst is disposed. Accordingly, the area occupied by the storage capacitor Cst in the circuit area CA may be reduced by about 20%.

The bank 300 having the bank hole 305 defined therein is disposed on the second planarization film 292 on which the first electrode 298 is formed. The bank 300 defines the light-emitting area EA and separates the sub-pixels from each other. The bank 300 covers an entirety of an exposed face of the first electrode 298 in the remaining area excluding the light-emitting area EA. The bank 300 may be formed in the area excluding the pad area P-P' so as not to cover the pad electrode PE.

Figure 6F:
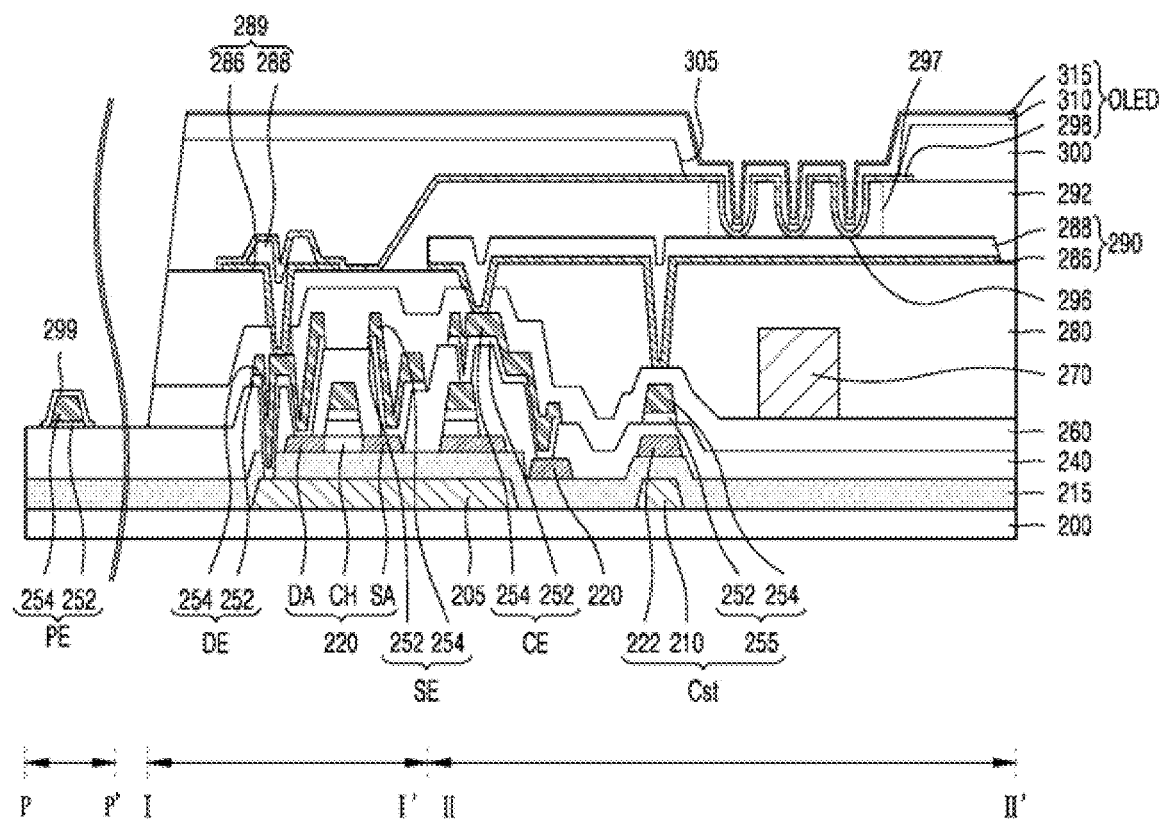

Referring to FIG. 6F, the organic light-emitting layer 310 and the second electrode 315 are formed on the bank 300 including the light-emitting area EA. Accordingly, the organic light-emitting element (OLED) composed of the first electrode 298, the organic light-emitting layer 310, and the second electrode 315 may be constructed. The organic light-emitting layer 310 and the second electrode 315 are formed in the remaining area excluding the pad area P-P'. The organic light-emitting layer 310 is formed to be in direct contact with the first electrode 298 exposed by the bank hole 300. Accordingly, the organic light-emitting layer 310 and the second electrode 315 have the concave shape at the concave portions 296 of the micro lens patterns 297a, 297b, and 297c.

As described above, as the organic light-emitting element (OLED) including the first electrode 298, the organic light-emitting layer 310, and the second electrode 315 is formed along the exposed faces of the micro lens patterns 297a, 297b, and 297c, the organic light-emitting element (OLED) has the concave shape at the concave portions 296 of the micro lens patterns 297a, 297b, and 297c.

In other words, the organic light-emitting element (OLED) may have the shape in which the hexagonal patterns are arranged to have the honeycomb structure in the plan view, but the present disclosure may not be limited thereto. For example, the organic light-emitting element (OLED) may have the shape in which the patterns of the various cross-sectional shapes such as the square shape or the elliptical shape are arranged.

Figure 7A:
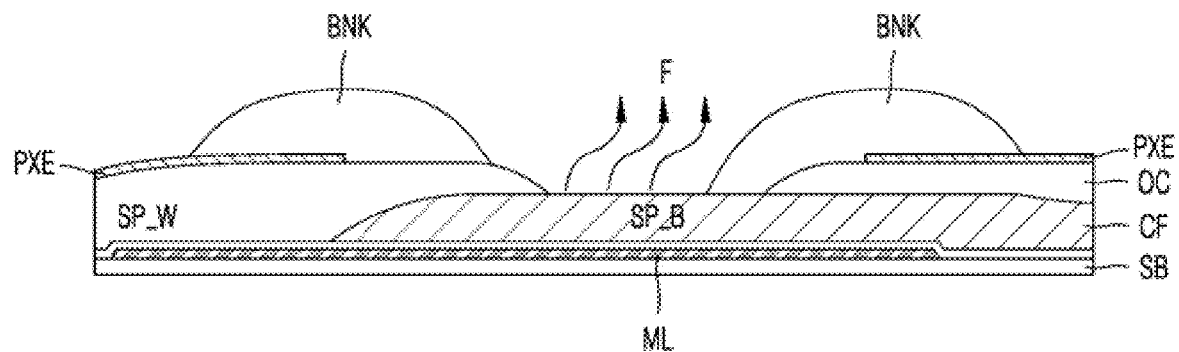
FIGS. 7A to 7C illustrate a pixel boundary according to one embodiment.
Figure 7B:
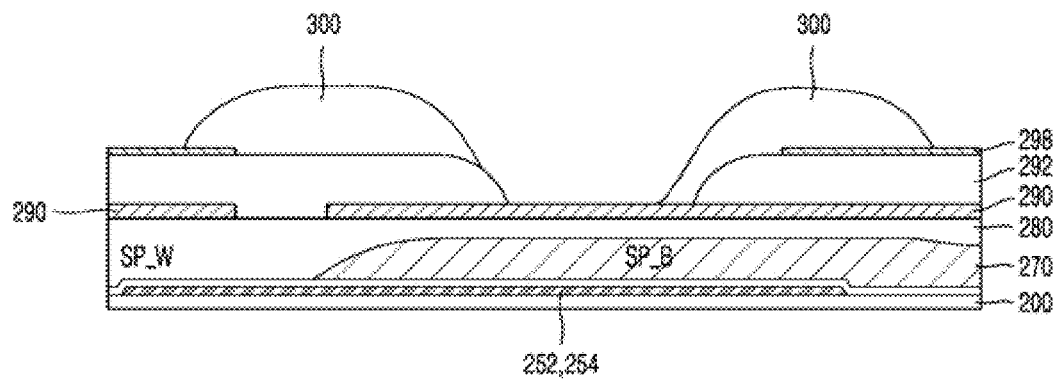
Figure 7C:
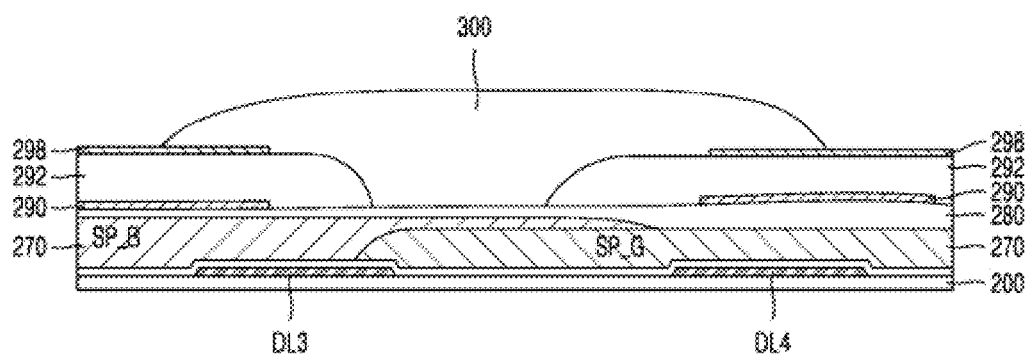

FIGS. 7A to 7C are diagrams for illustrating a pixel boundary of a display device according to one embodiment. In this regard, FIG. 7B is a cross-sectional view schematically illustrating a portion IV-IV' in FIG. 3 according to the second embodiment, and FIG. 7C is a cross-sectional view schematically illustrating a portion V-V' according to the second embodiment.

Referring to FIG. 7A, a bank BNK acts as a barrier for preventing or at least reducing light of different colors of adjacent pixels from being mixed with each other and output. In order to prevent or at least reduce light leakage from the adjacent sub-pixels, a planarization film OC between the banks BNK is opened. However, fume F, which is smoke generated by a chemical reaction that occurs from the color filter CF during the process, may be generated. When the fume F is generated while the planarization film OC is open, the generated fume F flows to and comes into contact with the organic light-emitting layer, causing damage to the organic light-emitting layer and causing a defect. In particular, such fume F is generated at a boundary between the white pixel SP_W and the red pixel SP_R or at a boundary between the white pixel SP_W and the blue pixel SP_B. In this regard, components that are not illustrated in the drawing are a substrate SB, a first electrode PXE, and a line electrode ML.

Accordingly, as shown in FIG. 7B according to embodiments of the present disclosure, when the color filter 270 is covered with the first planarization film 280 and the ashing stop film 290 is introduced between the first planarization film 280 and the second planarization film 292 at the boundary between the white pixel SP_W and the blue pixel SP_B, even when the fume is generated from the color filter 270, the fume may be prevented from flowing toward the organic light-emitting layer. Accordingly, the defect of the organic light-emitting layer may be prevented. This may be applied equally to the boundary between the white pixel SP_W and the red pixel SP_R.

In one example, as shown in FIG. 7C, because the fume is not generated as the boundary between the blue pixel SP_B and the green pixel SP_G is covered with the first planarization film 280 and the bank 300, the defect of the organic light-emitting layer does not occur even when the ashing stop film 290 is not introduced. This may be applied equally to the boundary between the green pixel SP_G and the red pixel SP_R.

According to the third embodiment of the present disclosure, as the second ashing stop film 290 located between the first planarization film 280 and the second planarization film 292 acts as the etching stop film, the plurality of micro lens patterns 297a, 297b, and 297c having the uniform depth may be realized. Accordingly, the stain defect caused by the formation of the micro lens array having the non-uniform vertical level or vertical dimension (or depth) may be prevented or at least reduced and the luminance may be increased.

Further, the capacitance of the storage capacitor may be further increased as the second ashing stop film act as the auxiliary capacitor together with the triple storage electrode. Accordingly, the area occupied by the storage capacitor in the circuit area may be reduced to secure the opening ratio, but the total area occupied by the storage capacitor in the sub-pixel may be widened by the auxiliary capacitor extending to the light-emitting area to stably maintain a light-emitting time of the sub-pixel.

In one example, the luminance may be improved by increasing an amount of light from an external light source by forming a partial area of the circuit area as a reflective area while introducing a micro lens array having the uniform vertical dimension.

This will be described below with reference to the drawings.

FIGS. 8A to 8J are diagrams for illustrating a method for manufacturing a display device according to a fourth embodiment of the present disclosure. In this regard, FIG. 8A to 8J are diagrams of FIG. 3 cut along P-P', I-I, II-II' directions. Further, components the same as or similar to those in FIG. 5A to 5D will be briefly described. Further, as the process proceeds in the same manner as that in FIG. 5A to 5D, the description thereof will be omitted, and description will be made from a subsequent operation.

As shown in FIGS. 5A to 5D, the interlayer insulating film 240 having the plurality of contact holes 242, 244, 246, 248, and 250 defined therein is formed on the substrate 200 on which the gate electrode GE is formed.

Figure 8A:
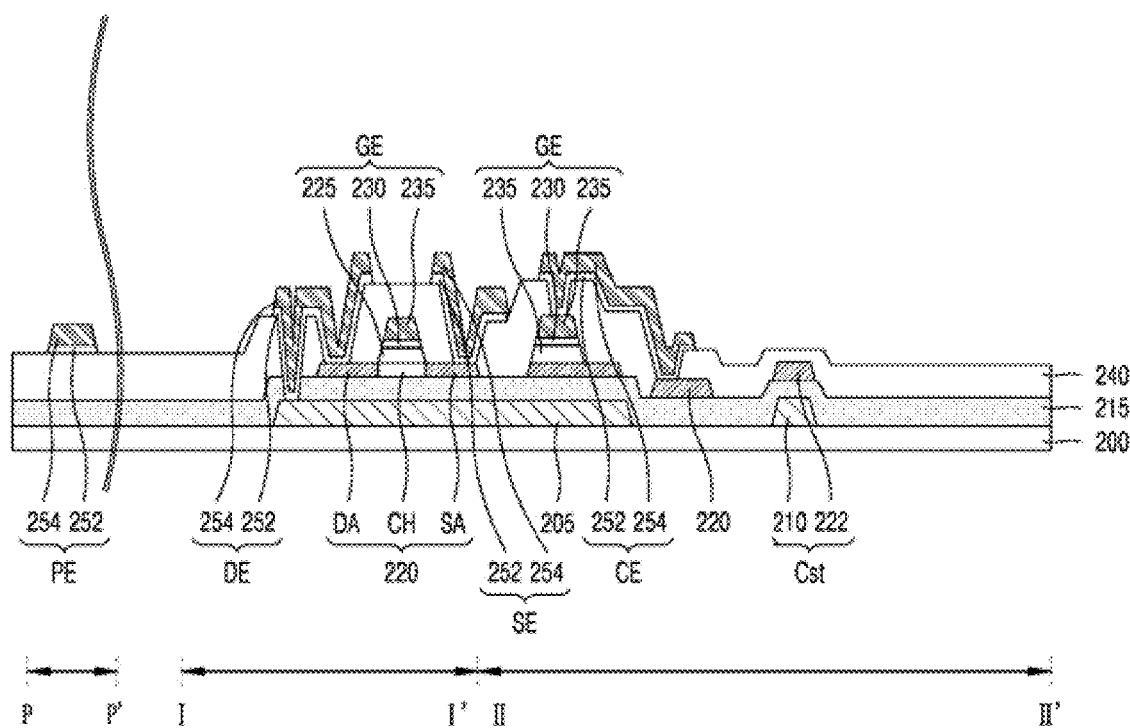
FIGS. 8A to 8J illustrating a method for manufacturing a display device according to a fourth embodiment of the present disclosure.

Then, as shown in FIG. 8A, the source electrode SE, the drain electrode DE, the auxiliary capacitor connection electrode CE, and the pad electrode PE are formed on the substrate 200. Subsequently, the metal layers 252 and 254 are formed on the substrate 200 on which the interlayer insulating film 240 is formed. The metal layers 252 and 254 may be formed in the structure in which the first metal layer 252 and the second metal layer 254 are stacked.

Then, the metal layers 252 and 254 are patterned to form the source electrode SE, the drain electrode DE, the auxiliary capacitor connection electrode CE, and the pad electrode PE. The patterning process may be performed as the dry etching scheme. As the source electrode SE, the drain electrode DE, the auxiliary capacitor connection electrode CE, and the pad electrode PE are formed by patterning the same metal layers 252 and 254, the source electrode SE, the drain electrode DE, the auxiliary capacitor connection electrode CE, and the pad electrode PE may be made of the same material and may be formed on the same plane. The auxiliary capacitor connection electrode CE may electrically connect the gate electrode GE and the active layer 220 to each other.

Figure 8B:
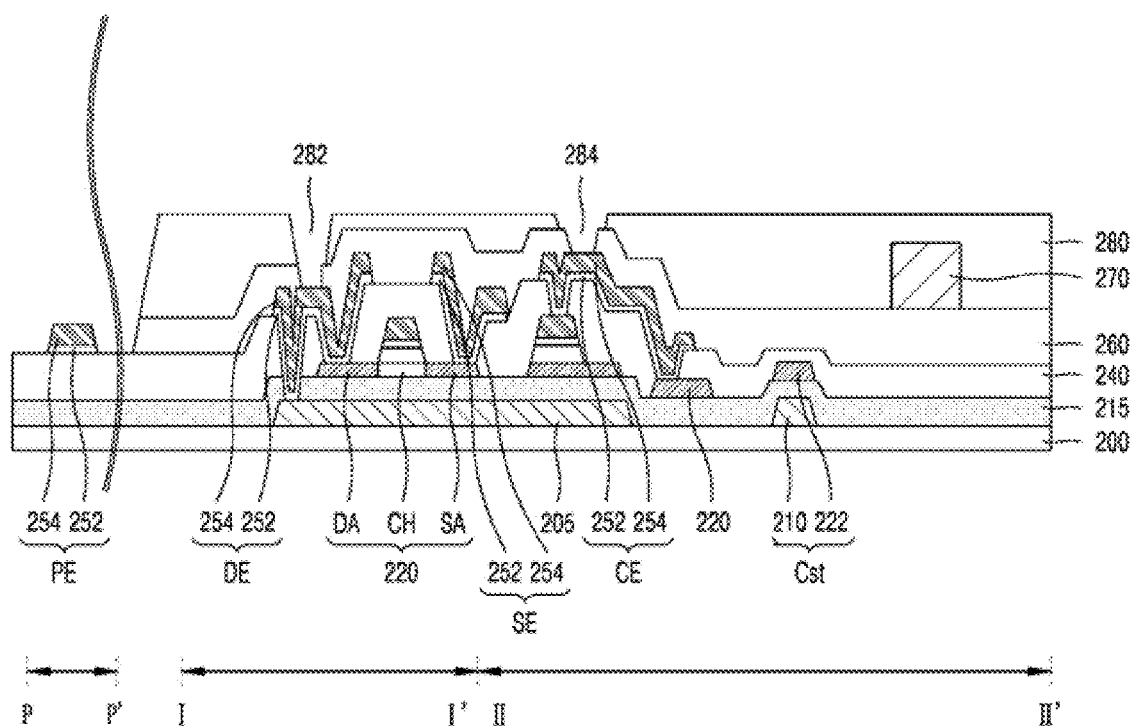

Referring to FIG. 8B, the protective layer 260 is formed on the substrate 200. The protective layer 260 is formed to have the thickness to cover all surfaces of the source electrode SE, the drain electrode DE, the auxiliary capacitor connection electrode CE, and the pad electrode PE. In this regard, the protective layer 260 may not be formed in the pad area P-P' in which the pad electrode PE is formed.

Then, the color filter 270 is formed on the protective layer 260. The color filter 270 may be formed to correspond to the light-emitting area by applying each of the red (R), green (G), and blue (B) pigments on the protective layer 260 and performing the mask process.

The first planarization film 280 is formed on the protective layer 260 on which the color filter 270 is disposed. The first planarization film 280 may be formed to have the thickness sufficient to have the flat surface on the substrate 200. Then, the first planarization film 280 and the protective layer 260 are patterned to form the pixel contact hole 282 that exposes the portion of the surface of the drain electrode DE and the auxiliary capacitor contact hole 284 that exposes the portion of the surface of the auxiliary capacitor connection electrode CE.

Figure 8C:
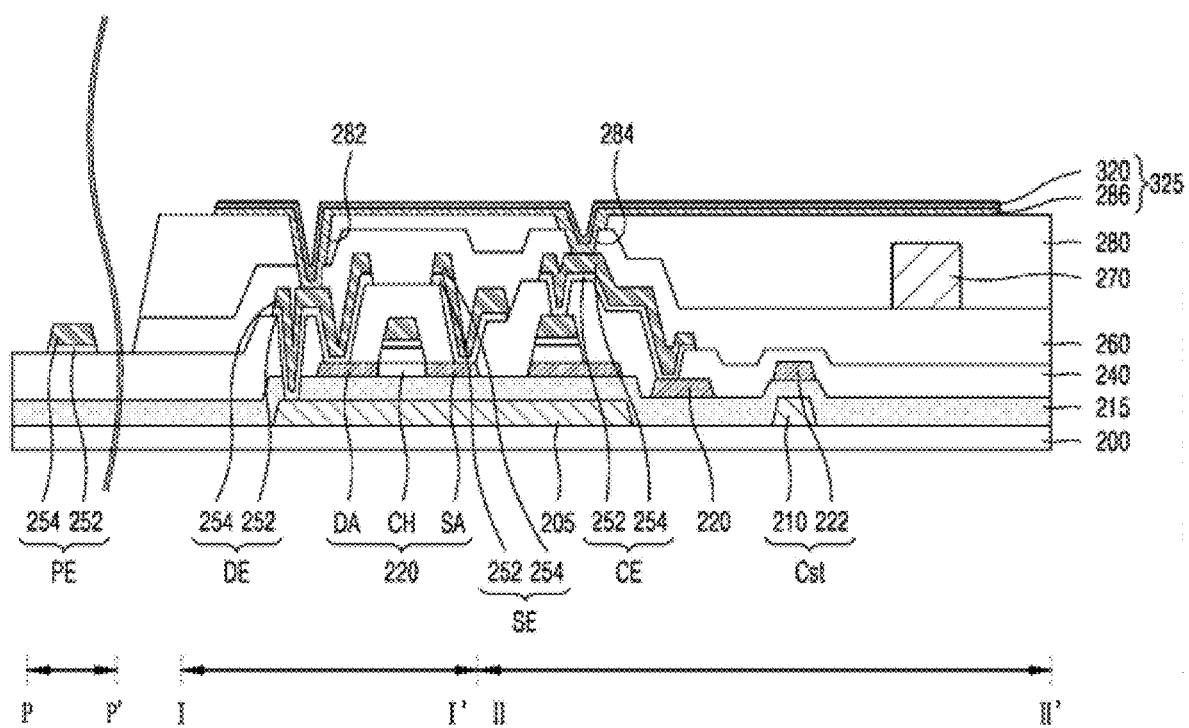

Referring to FIG. 8C, an ashing stop film 325 is formed on the first planarization film 280 in which the pixel contact hole 282, the auxiliary capacitor contact hole 284, and the capacitor contact hole 285 are defined.

The ashing stop film 325 serves to limit positions where the etching is stopped such that the vertical levels of the plurality of micro lens patterns may be uniform in the process of forming the micro lens patterns thereafter. The ashing stop film 325 may be formed to extend to an area where the light-emitting area is to be formed.

The ashing stop film 325 may be formed in a structure in which the transparent electrode 286 and the reflective electrode 320 are stacked such that the transparent electrode 286 is positioned at a lower portion and the reflective electrode 320 is positioned at an upper portion. In one example, the transparent electrode 286 may be made of the transparent metal oxide such as the indium-tin-oxide (ITO) or the indium-zinc-oxide (IZO). Further, the reflective electrode 320 may be formed to contain the semi-transmissive metal material such as silver (Ag), molybdenum (Mo), aluminum (Al), titanium molybdenum (MoTi), and an alloy thereof. In this regard, the transparent electrode 286 may be formed to have a thickness in a range from 200 Å to 1200 Å, and the metal layer 320 may be formed to have a thickness in a range from 300 Å to 2000 Å.

Figure 8D:
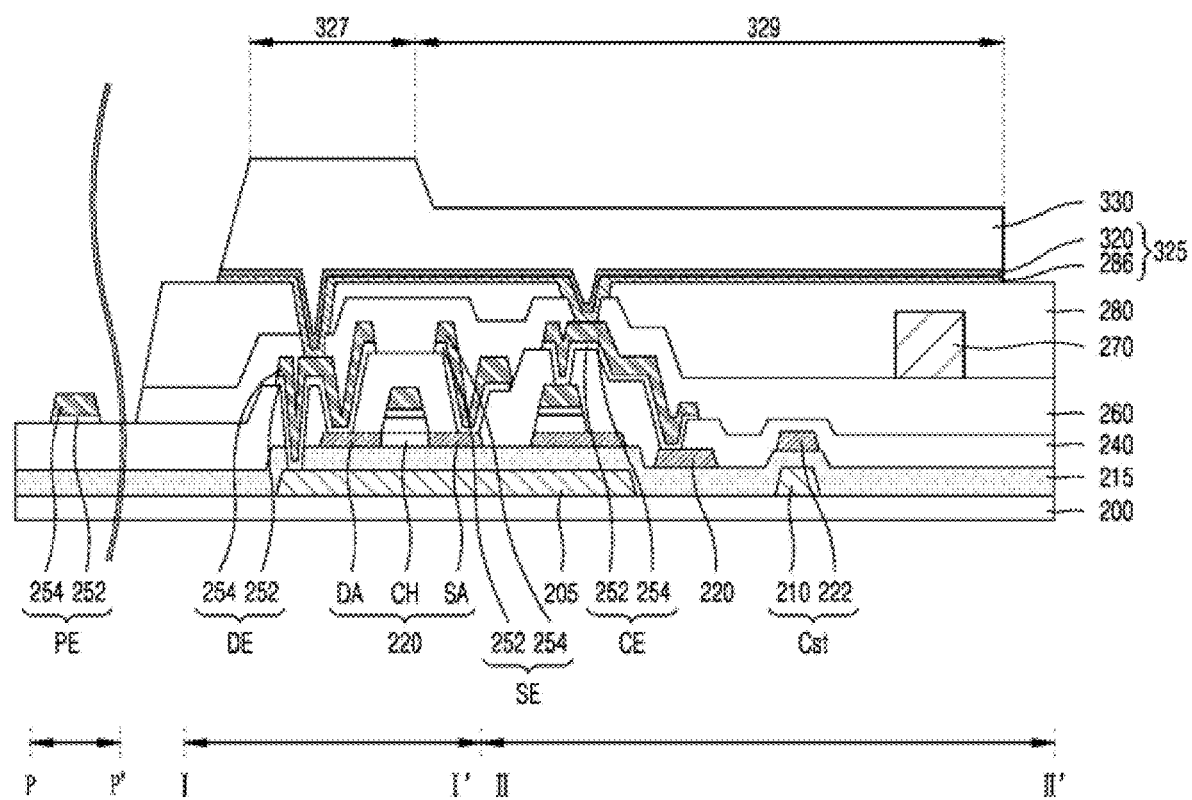

Referring to FIG. 8D, a half-tone photoresist pattern 330 is formed on the ashing stop film 325. The half-tone photoresist pattern 330 includes a full-tone area 327 with a first thickness and a half-tone area 329 with a second thickness relatively smaller than the first thickness of the full-tone area 327. In one example, a portion in which the full-tone area 327 is disposed is an area in which a reflective area to be formed later is disposed.

Figure 8E:
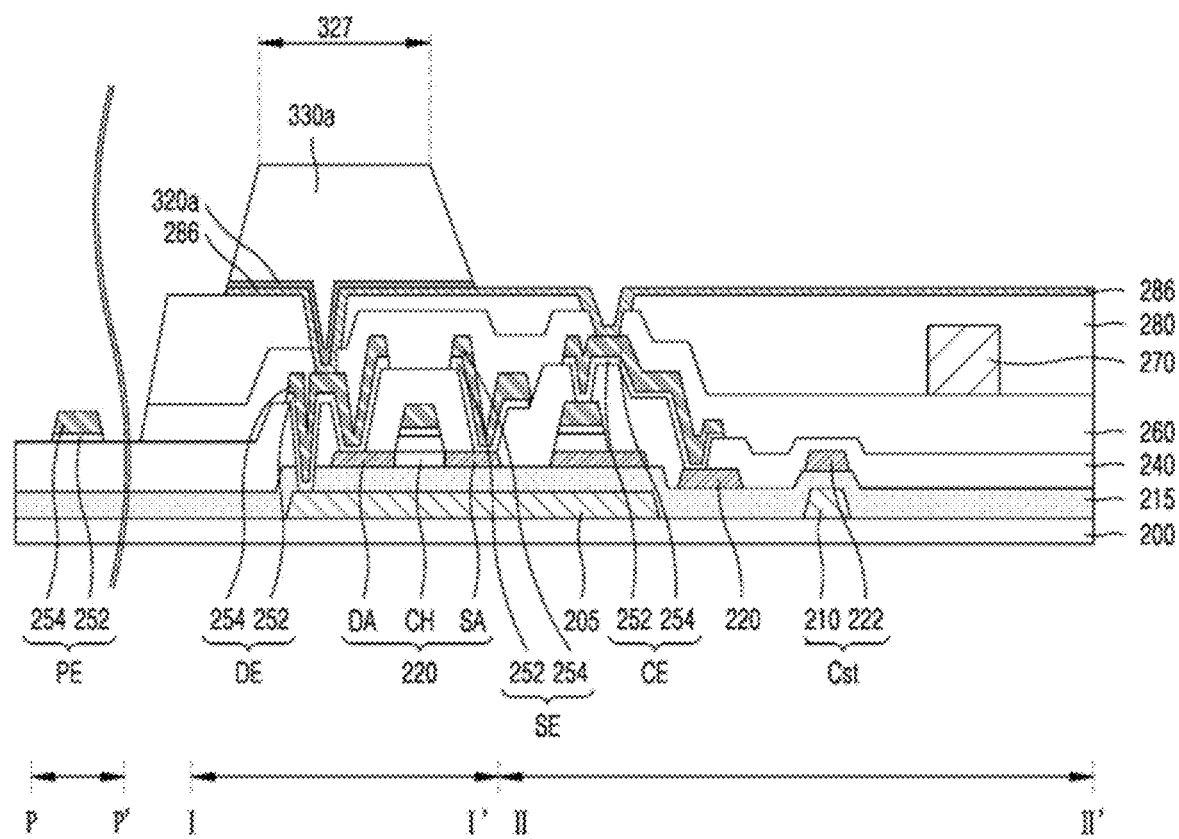

Referring to FIG. 8E, an ashing process is performed on the half-tone photoresist pattern 330. The ashing process may be performed in the dry etching scheme. The dry etching scheme has the same etching speed in a direction perpendicular to a surface of the pattern. Then, as a half-tone photoresist pattern of the half-tone area 329, which has the second thickness that is relatively smaller than the first thickness of the full-tone area 327, is removed and the reflective electrode beneath the half-tone photoresist pattern is also removed, a residual photoresist pattern 330a exposing the transparent electrode 286 is formed.

In this regard, during the ashing process, the half-tone photoresist pattern of the full-tone area 327 having the first thickness relatively greater than the second thickness of the half-tone area 329 is not entirely removed and remains as the residual photoresist pattern 330a.

Figure 8F:
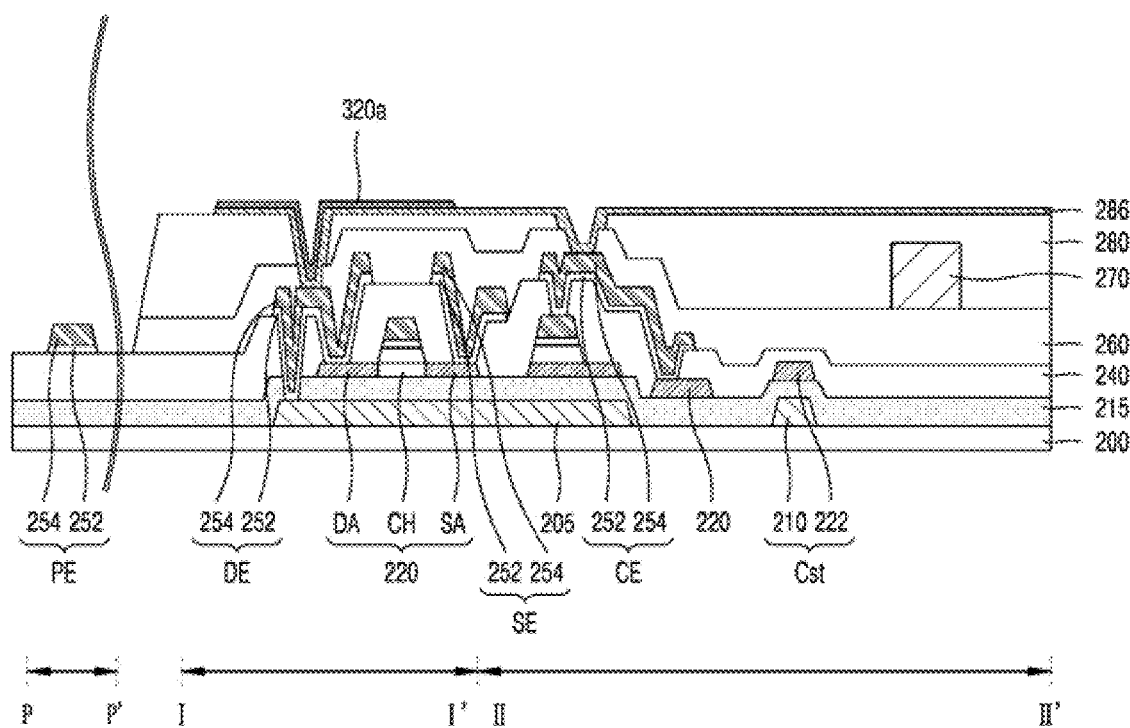

Referring to FIG. 8F, the strip process is performed to remove the residual photoresist pattern 330a. Then, the reflective electrode pattern 320a that was not etched by being covered by the residual photoresist pattern 330a is exposed. Accordingly, a structure in which the transparent electrode 286 and the reflective electrode pattern 320a are stacked is disposed in the circuit area CA (see FIG. 3), and the transparent electrode 286 remains as the ashing stop film in the light-emitting area EA (see FIG. 3).

Figure 8G:
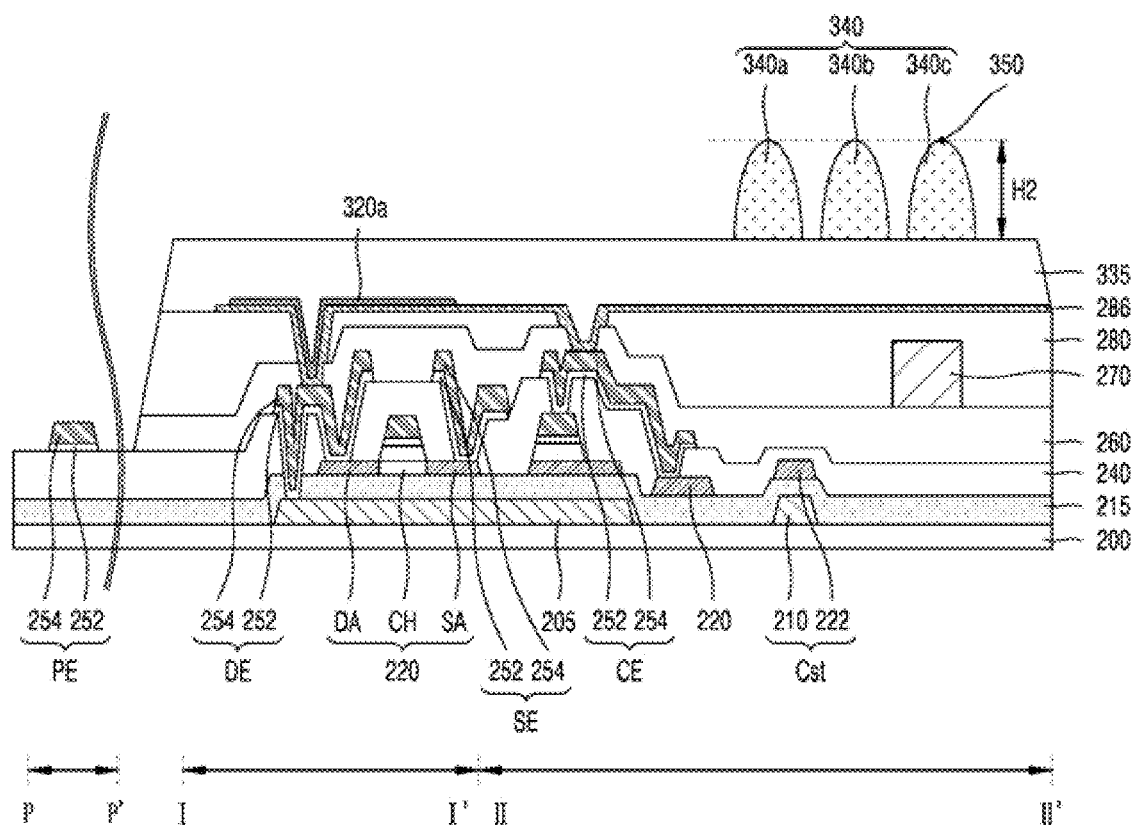

Referring to FIG. 8G, a second planarization film 335 is formed on the first planarization film 280 on which the transparent electrode 286, and the structure in which the transparent electrode 286 and the reflective electrode pattern 320a are stacked are formed. The second planarization film 335 may be made of the same material as that of the first planarization film 280. For example, the second planarization film 335 may be formed by applying the organic insulating material such as the acrylic resin. The second planarization film 335 may be formed to have a sufficient thickness such that the transparent electrode 286, and the structure in which the transparent electrode 286 and the reflective electrode pattern 320a are stacked may have flat surfaces.

Subsequently, a photoresist pattern 340 is formed on the second planarization film 335. The photoresist pattern 340 may include a plurality of photoresist lens patterns 340a, 340b, and 340c having the vertical dimension H2 and an open area for exposing the first planarization film 280 in the portion where the structure in which the transparent electrode 286 and the reflective electrode pattern 320a are stacked is formed. The portion in which the photoresist pattern 340 is formed is an area overlapping the light-emitting area to be formed later.

Figure 8H:
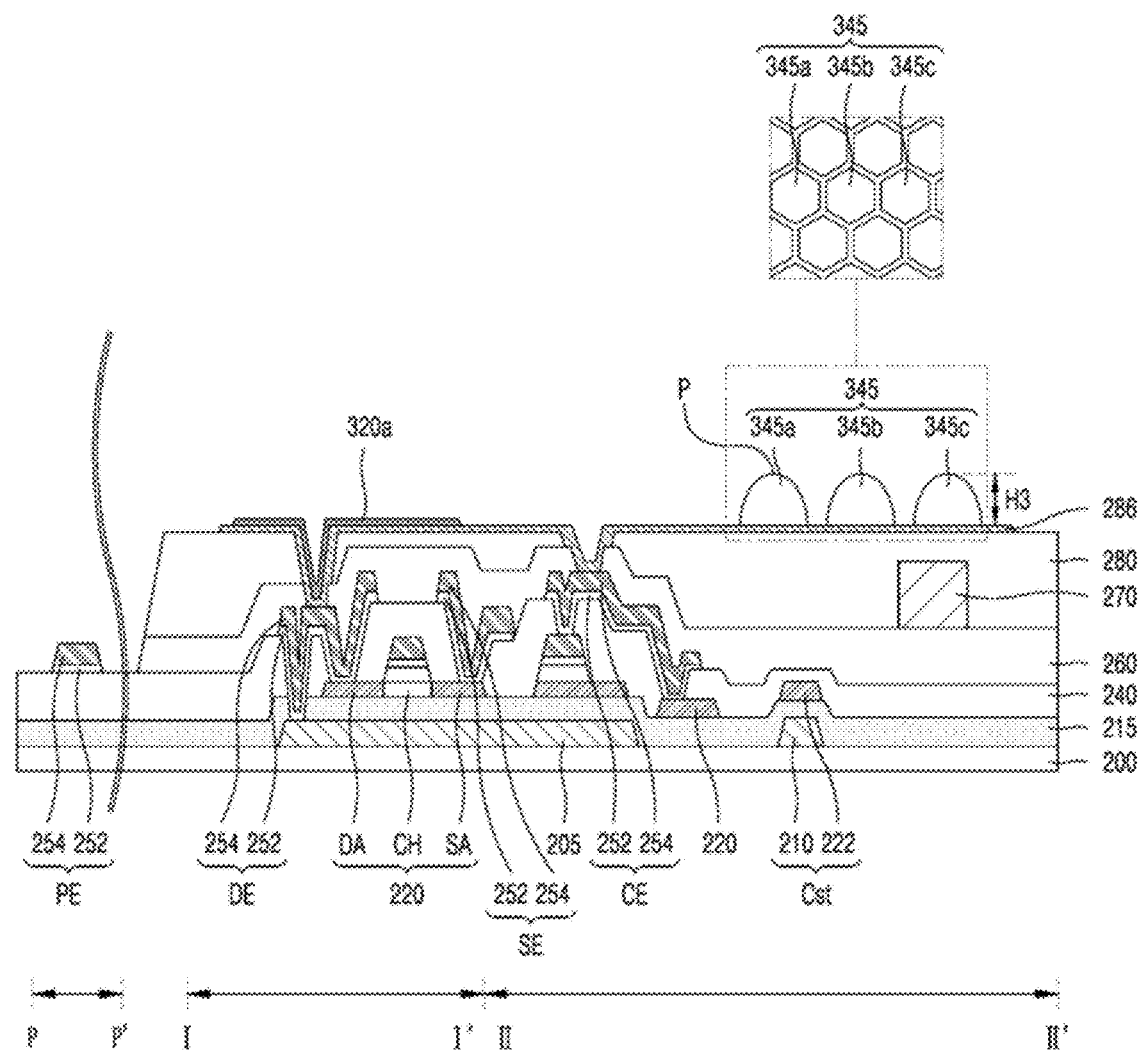

Referring to FIG. 8H, a micro lens array 345 is formed by etching the second planarization film 335 using the photoresist pattern 340 as the etching mask. The micro lens array 345 includes the plurality of micro lens patterns 345a, 345b, and 345c. The micro lens array 345 may be formed at a position overlapping the sub-pixel area to be formed later.

The plurality of micro lens patterns 345a, 345b, and 345c may include convex portions P having a hemispherical cross-section. As the transparent electrode 286 that serves as the ashing stop film in the etching process using the photoresist pattern 340 as the etching mask is located on the first planarization film 286, the plurality of micro lens patterns 345a, 345b, and 345c may be formed to have the same vertical dimension H3 at the convex portions P.

The plurality of micro lens patterns 345a, 345b, and 345c may be arranged such that the patterns having the hexagonal shape has the honeycomb structure in the plan view. In one example, each of the plurality of micro lens patterns 345a, 345b, and 345c may be formed to have a hemispherical, rectangular, or elliptical cross-sectional shape.

Figure 8I:
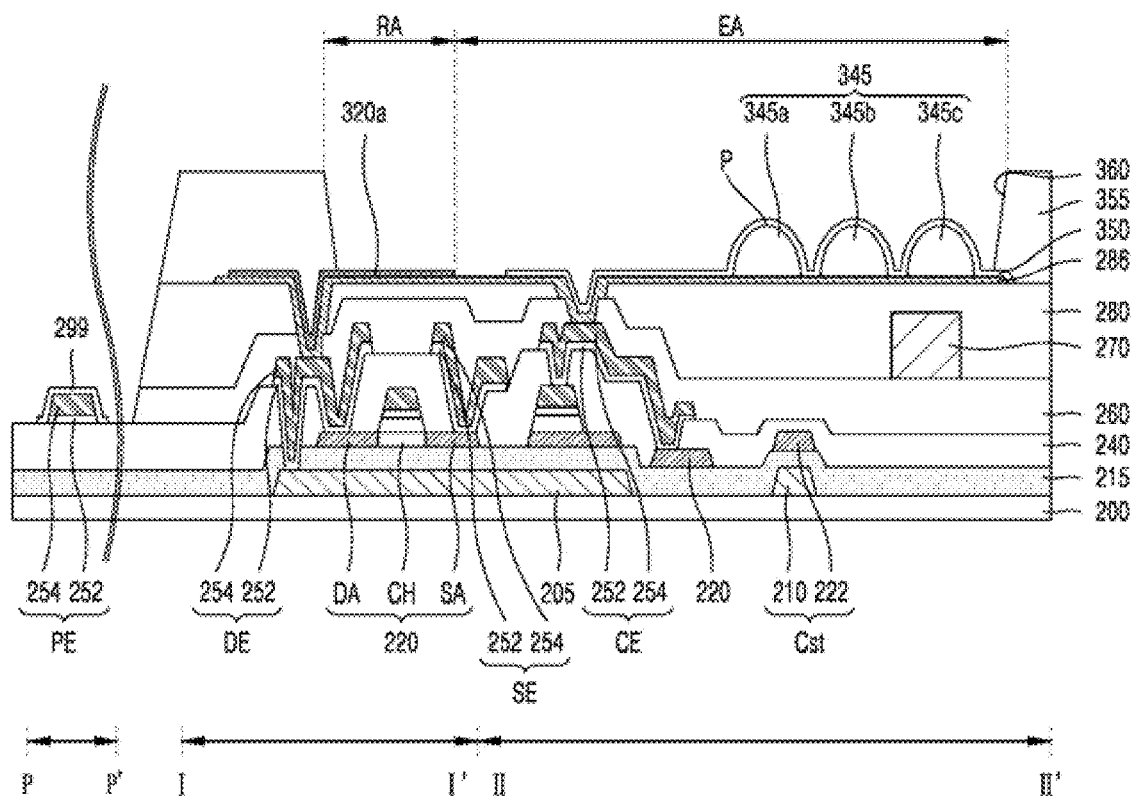

Referring to FIG. 8I, the first electrode 298 is formed on the micro lens array 345. The first electrode 298 may be formed to be in contact with the transparent electrode 286 serving as the ashing stop film. The first electrode 298 may be electrically connected to the drain electrode DE and the gate electrode GE via the transparent electrode 286. In an example, the first electrode 298 may be made of the transparent metal oxide such as the indium-tin-oxide (ITO) or the indium-zinc-oxide (IZO). Because the first electrode 298 is formed along the shapes of the micro lens patterns 345a, 345b, and 345c, the first electrode 298 has a convex shape at the convex portion P (see FIG. 8H) of the micro lens array 345. In one example, the first electrode 298 may be formed as the pad cover electrode 299 that prevents or at least reduces corrosion of the pad electrode PE by covering the exposed face of the pad electrode PE disposed in the pad area P-P'.

A bank 355 having a bank hole 360 defined therein is disposed on the first planarization film 280 on which the first electrode 298 and the reflective electrode pattern 320a are formed. The bank 355 as a boundary area defining the light-emitting area EA of the area in which the pixel is to be formed serves to separate the sub-pixels from each other. The bank hole 360 may be defined to extend from the light-emitting area EA to form a reflective area RA by exposing a portion of a surface of the reflective electrode pattern 320a. In this regard, the reflective area RA may be positioned to partially overlap the circuit area CA (see FIG. 3) below in which the driving circuit element including the transistor is disposed.

The bank hole 360 is defined to extend from the light-emitting area EA to the circuit area CA to form the reflective area RA by the reflective electrode pattern 320a, thereby increasing the amount of light in the light-emitting area EA by the reflection of the external light to improve the luminance. Further, as the light-emitting area EA is extended to the circuit area CA, power consumption in realizing the same luminance may be reduced to increase a lifespan of the organic light-emitting element.

The bank 355 may be formed in an area excluding the pad area P-P' so as not to cover the pad electrode PE covered with the pad cover electrode 299.

Figure 8J:
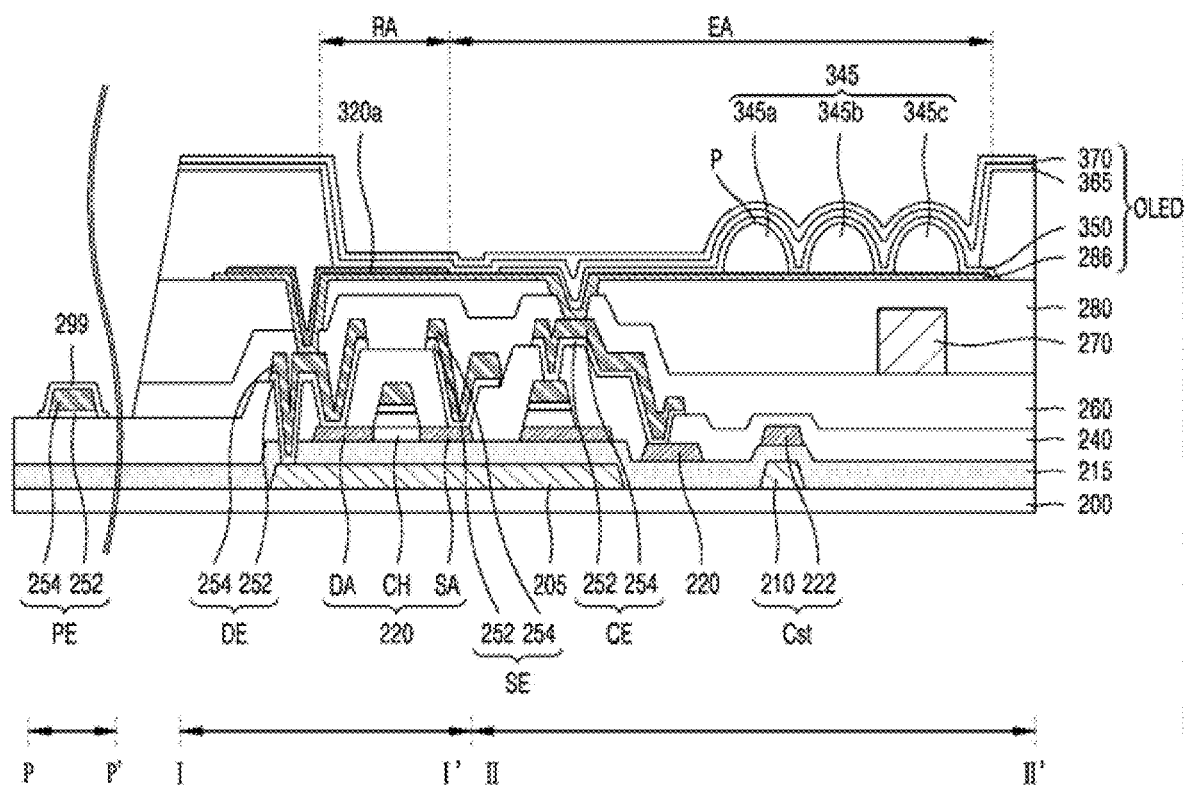

Referring to FIG. 8J, an organic light-emitting layer 365 and a second electrode 370 are formed on the bank 355 including the light-emitting area EA and the reflective area RA. Accordingly, an organic light-emitting element (OLED) composed of the transparent electrode 286, the first electrode 350, the organic light-emitting layer 365, and the second electrode 370 may be constructed. The organic light-emitting layer 365 and the second electrode 370 are formed in the remaining area excluding the pad area P-P'. The organic light-emitting layer 365 is formed to be in direct contact with the first electrode 350 exposed by the bank hole 360.

As the organic light-emitting element (OLED) including the transparent electrode 286, the first electrode 350, the organic light-emitting layer 365, and the second electrode 370 is formed along the exposed faces of micro lens patterns 345a, 345b, and 345c, the organic light-emitting element OLED has a convex shape at the convex portions P of the micro lens patterns 345a, 345b, and 345c.

According to embodiments of the present disclosure, as the ashing stop film is disposed as the etching stop film on the first planarization film and the micro lens array is formed using the photoresist pattern, the plurality of micro lens patterns having the same vertical dimension may be realized. Accordingly, the stain defect may be prevented from occurring due to the non-uniform vertical dimension.

Further, as the bank hole is defined to extend from the light-emitting area to the circuit area to form the reflective area by the reflective electrode pattern, the amount of light may be increased to improve the luminance and the power consumption in realizing the same luminance may be reduced to increase the lifespan of the organic light-emitting element.

A scope of protection of the present disclosure should be construed by the scope of the claims, and all technical ideas within the scope equivalent thereto should be construed as being included in the scope of the present disclosure. Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display device comprising:
    a substrate including a plurality of sub-pixels, each of the plurality of sub-pixels including a light-emitting area;
    a first planarization film on the substrate;
    an ashing stop film on the first planarization film;
    a second planarization film on the ashing stop film, the second planarization film including a micro lens array that overlaps the light-emitting area of at least one of the plurality of sub-pixels; and
    a first electrode on the second planarization film and an exposed surface of the micro lens array,
    wherein the ashing stop film is on an entire surface of the respective light-emitting area included in each of the plurality of sub-pixels.

2. The display device of claim 1, further comprising:
    an active layer including a channel area located on the substrate, a drain area and a source area arranged with the channel area interposed between the drain area and the source area;
    a gate electrode on the channel area of the active layer;
    a drain electrode that electrically connects the drain area and the first electrode to each other;

a source electrode connected to the source area of the active layer; and a pixel contact hole and an auxiliary capacitor contact hole on the gate electrode, the pixel contact hole penetrating through the first planarization film, wherein the ashing stop film is connected to the drain electrode and fills each of the pixel contact hole and the auxiliary capacitor contact hole, wherein the first electrode extends along a shape of the micro lens array and is in contact with an exposed surface of the ashing stop film that fills the pixel contact hole.

3. The display device of claim 1, wherein the ashing stop film includes a stacked structure of a transparent electrode and an insulating pattern.

4. The display device of claim 3, wherein the light-emitting area further includes an auxiliary capacitor, wherein the auxiliary capacitor comprises the transparent electrode, the insulating pattern of the ashing stop film and the first electrode, the transparent electrode and the first electrode are vertically located with the insulating pattern of the ashing stop film interposed therebetween.

5. The display device of claim 1, wherein the micro lens array includes a plurality of micro lens patterns, wherein each of the plurality of micro lens patterns includes at least one concave portion.

6. The display device of claim 5, wherein the plurality of micro lens patterns have a same vertical dimension.

7. The display device of claim 5, wherein the plurality of micro lens patterns in the micro lens array have a hexagonal shape and have a honeycomb structure in a plan view of the display device.

8. The display device of claim 5, wherein each of the plurality of micro lens patterns has a cross-sectional shape selected among a hemispherical shape, a square shape, or an elliptical shape.

9. The display device of claim 5, wherein the concave portion of the micro lens array is in contact with a top surface of the ashing stop film.

10. A display device comprising:
a substrate including a plurality of sub-pixels, each of the plurality of sub-pixels including a light-emitting area;
a circuit area where a driving circuit element is located;
a first planarization film on the substrate;
a transparent electrode on the first planarization film;
a reflective electrode pattern on the transparent electrode, the reflective electrode pattern overlapping the circuit area;
a bank exposing the reflective electrode pattern and the transparent electrode;
a micro lens array on the transparent electrode and disposed in the light-emitting area of at least one of the plurality of sub-pixels; and
a first electrode on an exposed surface of the micro lens array.

11. The display device of claim 10, further comprising:
a gate electrode on the substrate;
a source electrode and a drain electrode positioned to face each other with the gate electrode interposed the source electrode and the drain electrode;
an ashing stop film electrically connected to the gate electrode via the drain electrode; and
a pixel contact hole on the gate electrode, the pixel contact hole extending through the first planarization film,
wherein the first electrode is in contact with an exposed face of the transparent electrode while extending along a shape of the micro lens array.

12. The display device of claim 10, wherein the transparent electrode is on an entire surface of the light-emitting area included in at least one of the plurality of sub-pixels.

13. The display device of claim 10, wherein the micro lens array includes a plurality of micro lens patterns, wherein each of the plurality of micro lens patterns includes at least one convex portion.

14. The display device of claim 13, wherein the plurality of micro lens patterns have a same vertical dimension.

15. The display device of claim 13, wherein the plurality of micro lens patterns in the micro lens array have a hexagonal shape and have a honeycomb structure in a plan view of the display device.

16. The display device of claim 13, wherein each of the plurality of micro lens patterns has a cross-sectional shape selected among a hemispherical shape, a square shape, and an elliptical shape.

17. The display device of claim 10, wherein the reflective electrode pattern covers an entire face of the circuit area where the driving circuit element is positioned.

18. The display device of claim 10, wherein the reflective electrode pattern contains a semi-transmissive metal material containing at least one of silver (Ag), molybdenum (Mo), aluminum (Al), titanium molybdenum (MoTi), or an alloy thereof.

* * * * *